(12) United States Patent
Katano et al.

(10) Patent No.: US 6,485,203 B2
(45) Date of Patent: Nov. 26, 2002

(54) SUBSTRATE PROCESSING METHOD AND SUBSTRATE PROCESSING APPARATUS

(75) Inventors: Takayuki Katano, Nirasaki (JP); Hidefumi Matsui, Nirasaki (JP); Junichi Kitano, Nirasaki (JP); Yo Suzuki, Nirasaki (JP); Masami Yamashita, Nirasaki (JP); Toru Aoyama, Nirasaki (JP); Hiroyuki Iwaki, Nirasaki (JP); Satoru Shimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/737,473

(22) Filed: Dec. 18, 2000

(65) Prior Publication Data

US 2001/0014372 A1 Aug. 16, 2001

(30) Foreign Application Priority Data

Dec. 20, 1999 (JP) .......................... 11-361512
Dec. 21, 1999 (JP) .......................... 11-363085

(51) Int. Cl.$^7$ ................................. G03D 5/00
(52) U.S. Cl. ..................... 396/611; 118/52; 424/240
(58) Field of Search ................. 396/604, 611; 118/52, 54, 56, 319–321, 666, 69; 427/24 D; 134/902; 355/30, 27

(56) References Cited

FOREIGN PATENT DOCUMENTS

| JP | 63-294965 | * 12/1988 |
| JP | 2-13959 | * 1/1990 |
| JP | 3-259511 | * 11/1991 |
| JP | 2000-091226 | 3/2000 |
| JP | 2000-150335 | 5/2000 |

* cited by examiner

*Primary Examiner*—D Rutledge
(74) *Attorney, Agent, or Firm*—Rader, Fishman & Grauer PLLC

(57) ABSTRACT

A developing unit, a coating unit and a plurality of cooling plates are arranged in a process station which performs a resist coating and so on and a wafer is transferred among them by a substrate transfer device. The temperature of an area to where the wafer is transferred is detected by a temperature/humidity detector and the temperature of the wafer which is cooled by the cooling plates is adjusted accordingly based on a detected value so that the temperature of the wafer when transferred to the coating unit becomes a coating temperature of a processing solution. Thereby, the wafer is transferred to the coating unit while maintaining its temperature with high accuracy to be coated with a resist solution, so that a formation of an uneven processing due to the temperature change can be prevented and a uniform processing can be performed.

16 Claims, 24 Drawing Sheets

SUBSTRATE PROCESSING METHOD AND SUBSTRATE PROCESSING APPARATUS

BACKGROUND OF THE INVENTION

1. Field of the Invention

This invention relates to a substrate processing method and a substrate processing apparatus for performing, for example, a coating processing of a resist solution, a developing processing and the like on a substrate such as a semiconductor wafer, a glass substrate for a liquid crystal display and the like.

2. Description of the Related Art

In a lithography of a fabricating process of a semiconductor device, a resist is coated onto the surface of a semiconductor wafer (hereinafter referred to as a "wafer"), and thus coated resist is subjected to an exposure processing in accordance with a predetermined pattern and further to a developing processing to form a resist film of the predetermined pattern. A series of processings like this is performed by a system in which an exposure unit is connected to a coating/developing unit.

FIG. 10 is a plane view showing a conventional example of these units, in which a cassette C housing 25 substrates, for example, semiconductor wafers W is carried into a cassette stage 1 of a cassette station A1. A process station A2 is connected to the cassette station A1, and further, a not-shown exposure unit is connected to the process station A2 through an interface station A3.

The wafer W inside the cassette C on the cassette stage 1 is removed by a delivery arm 11 and sent to a coating unit 13 through a delivery section in a shelf unit 12 to be coated with the resist. Subsequently, the wafer W is transferred by the route of a wafer transfer means 14→a delivery section in a shelf unit 15→the interface station A3→the exposure unit to be exposed. The exposed wafer W is transferred to the process station A2 by the reverse route, developed in a not-shown developing unit provided in the lower tier of the coating unit 13, and then transferred by the route of the wafer transfer means 14→the delivery section in the shelf unit 12→the cassette C.

It should be noted that each shelf of the shelf unit 12, 15 is structured as a heating section, a cooling section, the delivery section of the wafer W, a hydrophobic section and so on, and before a resist coating and the developing processing, a heating processing and a cooling processing are performed in this order in the shelf unit 12, 15 in order to perform the resist coating or the like at a predetermined temperature. Incidentally, the delivery arm for delivering the wafer W between the process station A2 and the exposure unit is shown as number 16.

Further, a process area which comprises the coating unit 13 and the developing unit and a transfer area in which the wafer transfer means 14 is arranged are partitioned off in the process station A2, and an atmosphere of a clean room is taken in as well as the air the temperature and the humidity of which are adjusted in a predetermined manner is flowed in the process area, whereby the area have, so to speak, the atmosphere which is adjusted with high accuracy.

SUMMARY OF THE INVENTION

Note that the present inventors find out that a film thickness of a resist and a developing line width are highly dependent on a processing temperature, as shown with a temperature dependency of the film thickness of the resist in FIG. 11 and with a temperature dependency of the developing line width in FIG. 12, and if the processing temperature changes 2° C., the film thickness of the resist and the developing line width change significantly.

In a coating/developing unit, a wafer W undergoes a predetermined processing in, for example, hydrophobic sections in shelf units 12, 15, then cooled to a predetermined temperature in a cooling section, and coated with a resist in a coating unit 13, in which the wafer W is transferred from the cooling section to the coating unit 13 via a transfer area the temperature and the humidity of which are not adjusted. Therefore, even if the temperature of the wafer W is adjusted in the cooling section, it is influenced by the temperature of the transfer area during the subsequent transfer, and the temperature of the wafer W in coating the resist differs from that of the scheduled in the end, which may results in a change in the film thickness of the resist and a worse uniformity of the film thickness.

In order to prevent this, it may be possible to think of making an entire process station A2 to be an atmosphere adjusted with high accuracy in which the temperature and the humidity are adjusted, which causes a disadvantage that an increasing area for adjusting its atmosphere costs more.

An object of the present invention is to provide a substrate processing method and a substrate processing apparatus which can improve the uniformity of the processing by performing a coating processing of a coating solution in a state with the temperature and the humidity of a substrate adjusted with high accuracy.

To attain this object, the substrate processing method of the present invention for transferring the substrate cooled by the cooling plate to a coating processing section and for coating the processing solution onto the substrate in the coating processing section, comprising the steps of: detecting the temperature of an area to where the substrate is transferred, and adjusting the temperature of the substrate cooled by the cooling plate based on the detected temperature so that the temperature of the substrate transferred to the coating processing section is made to be the same with a supplying temperature of the processing solution.

The substrate processing method like this is, in concrete, performed by the substrate processing apparatus having a cassette station which includes a mounting portion for mounting a substrate cassette housing a plurality of substrates and a delivery device for delivering the substrate to the substrate cassette mounted on the mounting portion, and the process station connected to the cassette station for processing the substrate transferred by the delivery device, and the process station comprises: the cooling plate for cooling the substrate, the coating processing section for coating a processing solution onto the substrate, a substrate transfer device for transferring the substrate cooled by the cooling plate to the coating processing section, a temperature/humidity detector for detecting the temperature of the area to where the substrate is transferred by the substrate transfer device, and a control section for adjusting the temperature of the cooling plate so that the temperature of the substrate when transferred to the coating processing section becomes the same with the coating temperature of the processing solution based on a detected value by the temperature/humidity detector.

In the structure like this, the temperature of the area to where the wafer is transferred is detected and the temperature of the substrate which is cooled by the cooling plate is adjusted accordingly based on a detected value so that the temperature of the substrate when transferred to the coating processing section becomes the coating temperature of the processing solution, whereby, the coating processing can be performed while maintaining the temperature of the substrate with high accuracy, which makes it possible that a formation of an uneven processing due to the temperature change can be prevented and a uniformity of the coating processing can be improved.

Further, the substrate processing method of the present invention for transferring the substrate cooled by the cooling plate to a coating processing section and for coating the processing solution onto the substrate in the coating processing section, further comprising the step of: transferring the substrate from the cooling plate to the coating processing section while supplying the gas with its temperature adjusted onto the surface to be processed of the substrate.

The substrate processing method like this is performed by the substrate processing apparatus having the cassette station which includes the mounting portion for mounting the substrate cassette housing a plurality of substrates and the delivery device for delivering the substrate to the substrate cassette mounted on the mounting portion, and the process station connected to the cassette station for processing the substrate transferred by the delivery device, and the process station comprises: the cooling plate for cooling the substrate, the coating processing section for coating the processing solution onto the substrate, the substrate transfer device for transferring the substrate between the cooling plate and the coating processing section, and a gas supply part for supplying the gas to the surface to be processed of the substrate with its temperature adjusted, while the substrate is transferred from the cooling plate to the coating processing section by the substrate transfer device.

In the structure like this, the substrate is transferred from the cooling plate to the coating processing section while supplying the gas with its temperature adjusted onto the surface to be processed of the substrate so that the temperature change can be prevented during the transfer, the coating processing can be performed in a state with the temperature of the substrate adjusted with high accuracy, and the uniformity of the processing can be improved. Here, it is preferable that the temperature of the gas which is supplied from the gas supply part to the surface to be processed of the substrate is adjusted to a processing temperature in the coating processing section, in which case the temperature change of the substrate during the transfer can be further prevented and the uniformity of the processing can be further improved.

In concrete, the present invention is structured to include an exposure unit which is provided to the opposite side of the cassette station of the process station and an interface station connected to the opposite side of the cassette station of the process station for delivering the substrate between the process station and the exposure unit, in which the coating processing section is for performing the coating processing onto the substrate, and further structured to include the exposure unit which is provided to the opposite side of the cassette station of the process station and the interface station connected to the opposite side of the cassette station of the process station for delivering the substrate between the process station and the exposure unit, in which the coating processing section is for performing the developing processing onto the substrate which is exposed in the exposure unit.

According to another aspect, the substrate processing apparatus of the present invention includes the cassette station which includes the mounting portion for mounting the substrate cassette housing a plurality of substrates and a delivery means for delivering the substrate to the substrate cassette mounted on the mounting portion, and the process station connected to the cassette station for processing the substrate transferred by the delivery means, and the process station comprises: the coating processing section for coating the processing solution onto the substrate, a substrate transfer means for delivering the substrate to the coating processing section, the cooling section for cooling the substrate, and a transfer means for transferring the substrate between the coating processing section and the cooling section, which is characterized in that the coating processing section and the cooling section are provided adjacently to each other and that a transfer area which is exclusive to the transfer means is formed adjacently to the coating processing section and the cooling section.

In the structure like this, the transfer of the substrate between the coating processing section of the process section and the cooling section for cooling the substrate is performed by the exclusive transfer means via the exclusive transfer area, and hence a burden imposed on the substrate transfer means can be lightened.

On this occasion, the transfer area which is exclusive to the transfer means may be a spatially closed area partitioned off from other areas, in which case the influence of heat by a heating section becomes less because the area is separated from the heating section for heating the substrate. Therefore, the temperature change of the substrate can be retarded during the transfer of the substrate in the area, a formation of the uneven processing due to the temperature change can be prevented, and a uniformity of the coating processing can be improved. Here, when the temperature of the transfer area which is exclusive to the transfer means is adjusted, the temperature change of the substrate can be further prevented during the transfer of the substrate in the area and the uniformity of the coating processing can be further improved.

Further, the cooling section may be a spatially closed area partitioned off from other areas, in which case the influence of heat from other areas becomes less and hence a temperature adjustment becomes easier. Furthermore, the coating processing section may be a spatially closed area partitioned off from other areas, in which case each of the coating processing section, the cooling section and the transfer area is spatially closed and hence it is possible to adjust the atmosphere in each area separately and it can be applied to the processing in which the atmosphere in each section is different.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
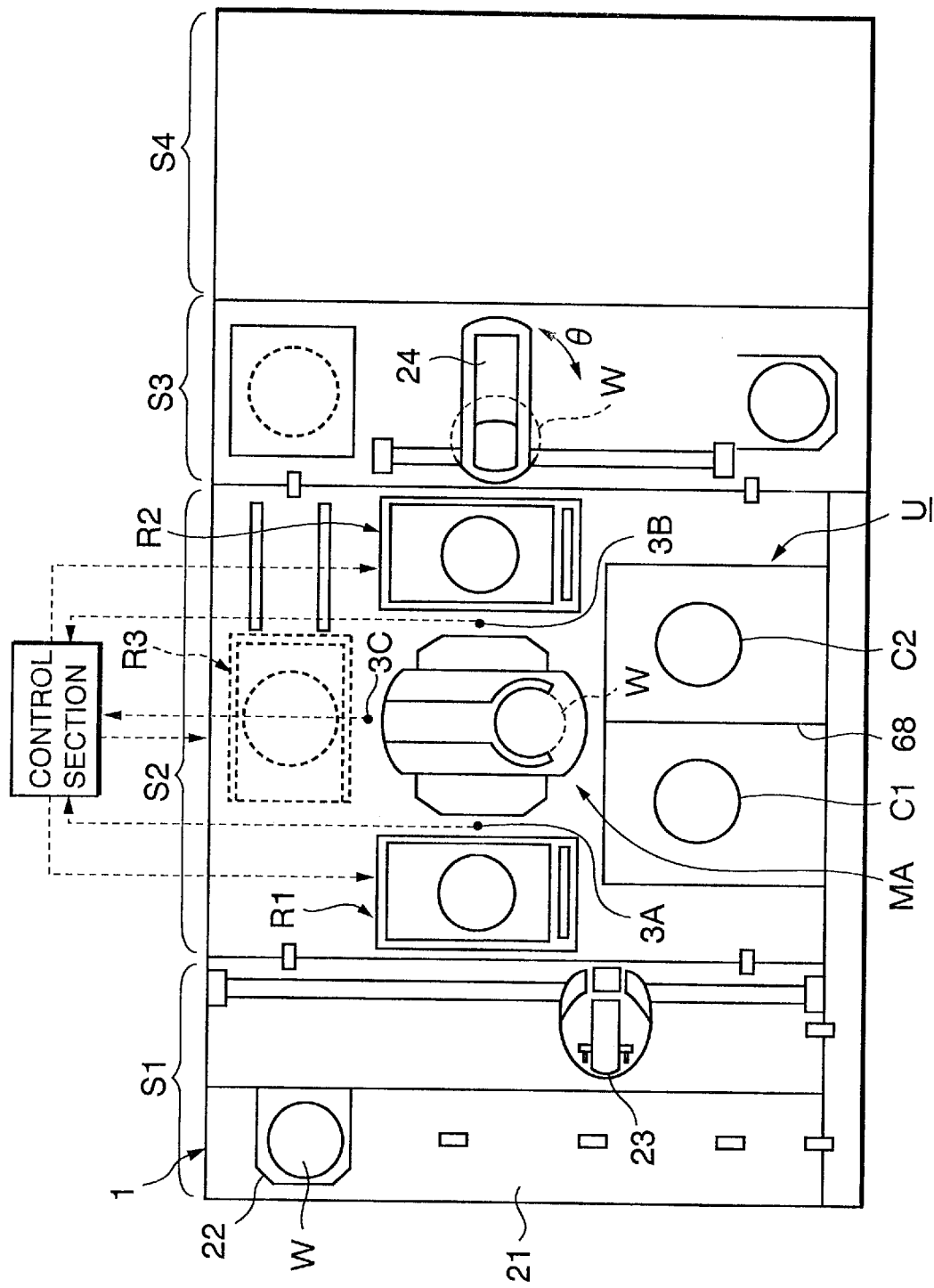
FIG. 1 is a schematic plane view of a coating and developing unit according to an embodiment of the present invention.
Figure 2:
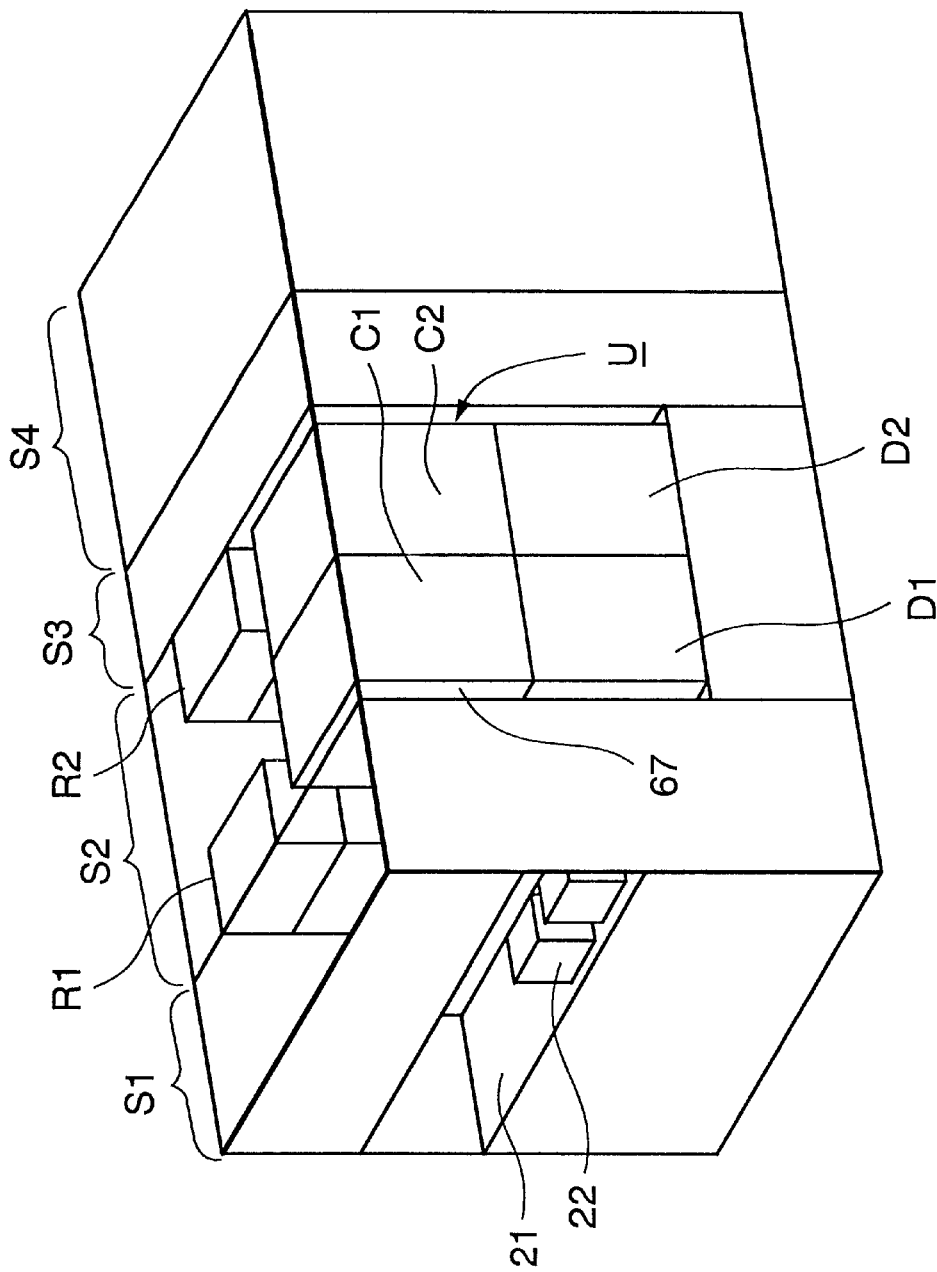
FIG. 2 is a perspective view of the coating and developing unit.

Hereinafter, preferred embodiments in which the present invention is applied to a coating and developing unit of a substrate will be explained. FIG. 1 is a schematic plane view of this embodiment, FIG. 2 is a perspective view showing an interior seen through, in which S1 is a cassette station, S2 is a process station for performing a coating processing of a resist and a developing processing on a wafer W, S3 is an interface station, and S4 is an exposure unit.

The cassette station S1 includes a cassette stage 21 as a mounting portion which mounts a wafer cassette (hereinafter referred to as a "cassette") 22 such as four substrate cassettes housing a plurality of substrates, for example, 25 wafers W, and a delivery arm 23 as a delivery device which delivers the wafer W between the cassette 22 on the cassette stage 21 and the process station S2. The delivery arm is structured to be ascendable and descendable, movable in an X direction and a Y direction, and rotatable around a vertical axis.

Further, the process station S2 includes, for example, two coating units C (C1, C2), for example, two developing units D (D1, D2), for example, three shelf units R (R1, R2, R3), for example, one substrate transfer device MA, for example, three temperature/humidity detectors 3 (3A, 3B, 3C) for detecting the temperature of a transfer area which is described later, a control section 30, and a plurality of cooling sections 4 the temperature of which is controlled by the control section 30 based on a detected value by the aforesaid temperature/humidity detectors, and is structured to deliver the wafer W between the cassette station S1 and the interface station S3, and to perform a coating processing of a resist solution on the wafer W, a developing processing of the wafer W, and a heating/cooling processing of the wafer W to a predetermined temperature before/after these processings in the station S2.

In explanation of an example of a layout of the process station S2 like this, process units U including the coating unit C and the developing unit D and so on are provided with two tiers on the back side of the aforesaid delivery arm 23, for example, on the right side when, for example, the back side seen from the cassette station S1. That is, the coating units C1, C2 as two coating processing sections are arranged side by side in a direction almost perpendicular to an alignment direction of the cassette on the cassette stage 21 with the coating unit C1 on the front side, and in the lower tiers of these coating units C1, C2, the developing units D1, D2 as two developing processing sections are arranged side by side with the developing unit D1 on the front side. Incidentally, in the following explanation, the cassette station S1 side is referred to as the front side and the exposure unit S4 side is referred to as the back side.

Moreover, on the left side of the process units U as seen from the cassette station S1, the substrate transfer device MA which is structured, for example, to be ascendable and descendable, movable in right and left and in back and forth, and rotatable around a vertical axis is provided to deliver the wafer W among the coating units C, the developing units D and the shelf units R. Further, the shelf unit R1 is arranged on the front side of the substrate transfer device MA as seen from the cassette station S1 side, the shelf unit R2 is arranged on the back side, and the shelf unit R3 is arranged on the left side, respectively. It should be noted that in FIG. 2, the shelf unit R3 and the substrate transfer device MA are omitted for convenience.

Figure 3:
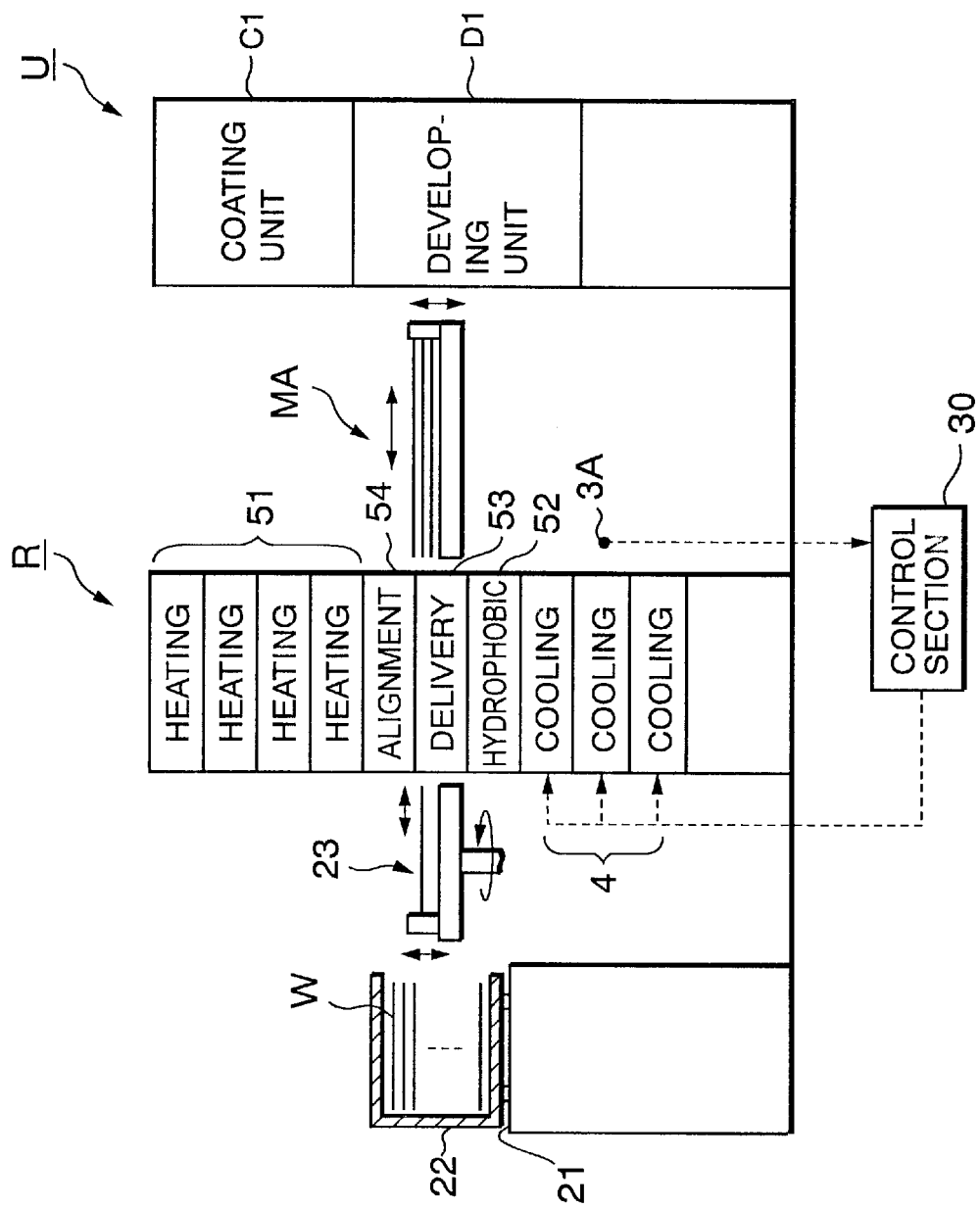
FIG. 3 is a side view of an example of a shelf unit and a process unit of the coating and developing unit.

Supposing that an area where the shelf units R1 to R3 and the substrate transfer device MA are placed for transferring the wafer W among the shelf units R and the process units U is called as the transfer area, the aforesaid three temperature/humidity detectors 3 are provided in the transfer area among the respective shelf units R1 to R3 and the substrate transfer device MA in such a manner to detect the temperature of this area in this example. As shown with the shelf unit R1 as a representative in FIG. 3, heating sections 51 for heating the wafer W, a hydrophobic section 52 for making the surface of the wafer W hydrophobic, a delivery section 53 including a delivery table for delivering the wafer W between the delivery arm 23 of the cassette station S1 and the substrate transfer device MA in the shelf unit R1 and for delivering the wafer W between a later-described delivery arm 24 of the interface station S3 and the substrate transfer device MA in the shelf unit R2, and an alignment section 54 for performing alignment of the wafer W in the shelf unit R1 are vertically arranged in the aforesaid shelf units R (R1, R2, R3).

Figure 4:
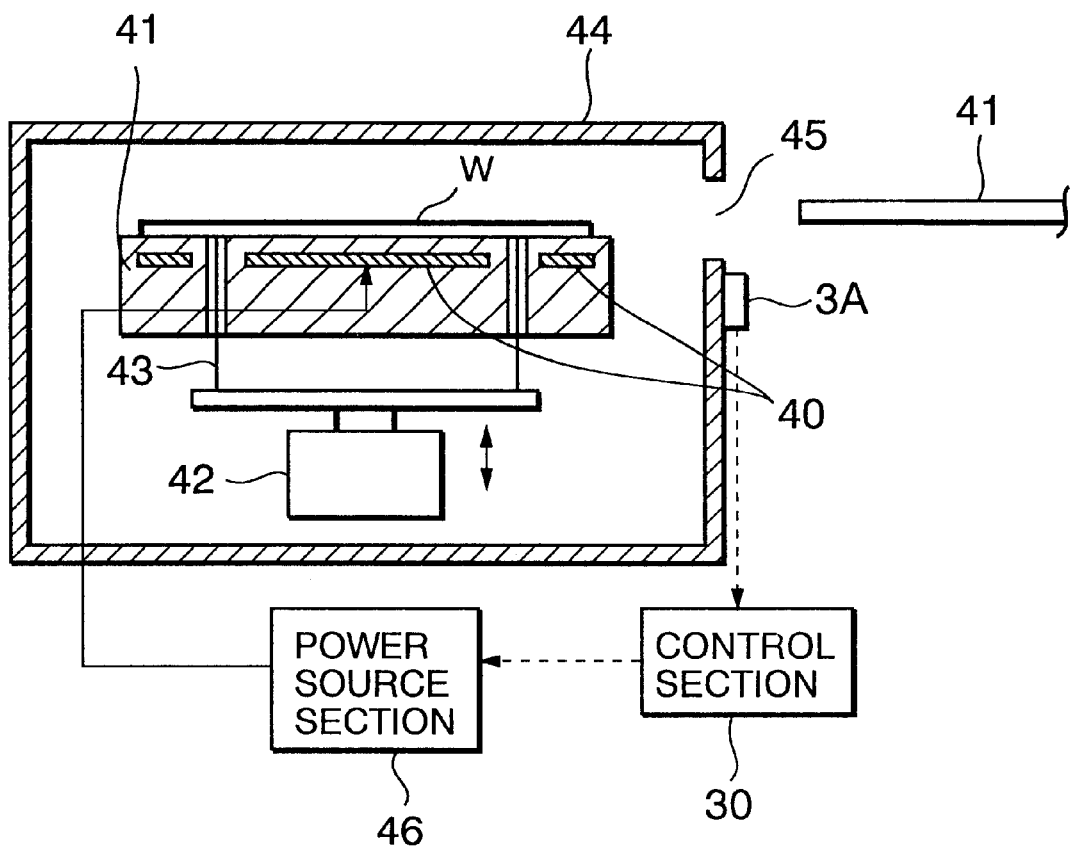
FIG. 4 is a sectional view of an example of a cooling section of the coating and developing unit.

In the aforesaid cooling section 4, for example as shown in FIG. 4, the wafer W is mounted on the surface of a cooling plate 41 in which, for example, a thermo module 40 is embedded to thereby cool the wafer W to a predetermined temperature. A raising and lowering pin 43 which is raised and lowered by a raising and lowering mechanism 42 is provided on the cooling plate 41 in order to deliver the wafer W to the plate 41.

The aforesaid cooling plate 41 is housed in, for example, a case 44, and a delivery port 45 of the wafer W is formed at a position corresponding to an arm 71 of the substrate transfer device MA in the case 44. Further, the temperature/humidity detector 3A made of, for example, a thermocouple, a temperature measuring registor or the like is attached, for example, on the surface of the case 44 which opposes to the substrate transfer device MA, and the temperature/humidity detector 3A detects the temperature of the transfer area between the shelf unit R1 and the coating processing section 5.

The temperature of the aforesaid thermo module 40 in the cooling plate 41 is controlled in a predetermined manner by the control section 30 based on the detected value of the aforesaid temperature/humidity detector 3A (the temperature of the transfer area), whereby the temperature of the wafer W is controlled with high accuracy in the cooling section 4.

In concrete, the aforesaid thermo module 40 is a semiconductor device which can transfer heat from a heat absorbing side to a heat radiating side by the passage of a direct current, and a calorific value changes by changing the amount of passing current. Therefore, a control signal is outputted from the control section 30 to a power source section 46 of the thermo module 40 based on the detected value of the aforesaid temperature/humidity detector 3A to thereby pass a predetermined amount of current accordingly, which makes it possible to control the cooling plate 41 to a predetermined temperature.

Figure 5:
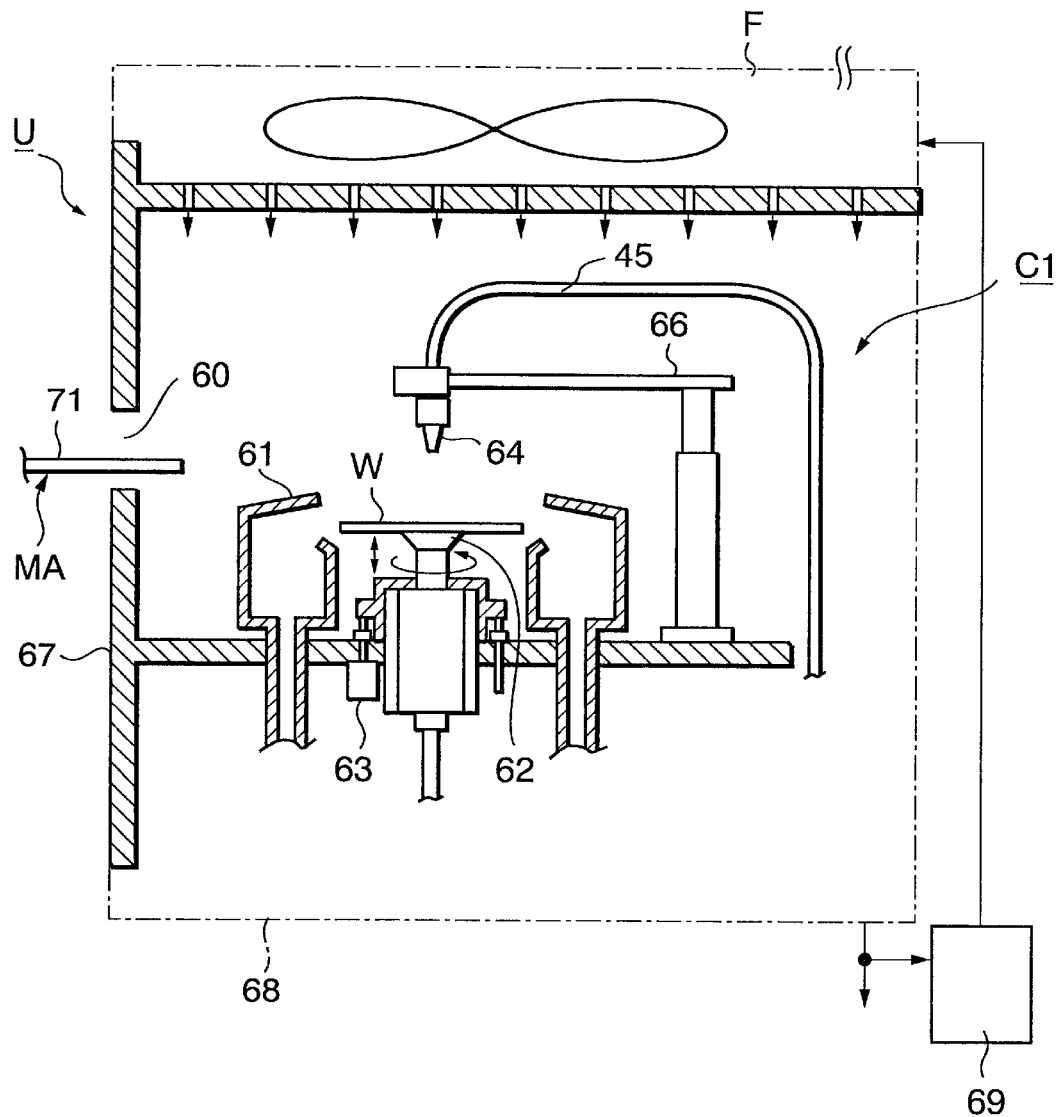
FIG. 5 is a sectional view of an example of a coating unit of the coating and developing unit.

Next, in explanation of the aforesaid coating unit C based on, for example, FIG. 5, in which a cup is shown as number 61, and a spin chuck 62 which has a function of vacuum sucking is provided rotatably inside the cup 61. The spin chuck 62 is structured to be ascendable and descendable by a raising and lowering mechanism 63, and when it is positioned on the upper side of the cup 61, the wafer is delivered to the later-described arm 71 of the aforesaid substrate transfer device MA.

Regarding the delivery of the wafer W, the wafer W on the arm 71 is delivered to the spin chuck 62 on the upper side of the cup 61, to which it is relatively raised from its lower side, and delivered from the spin chuck 62 side to the arm 71 by the reverse operational sequences. A discharge nozzle of a processing solution is shown as number 64, a processing solution supply pipe as number 65, and a supporting arm for moving the nozzle horizontally as number 66, in which the resist solution as the processing solution is dropped onto the surface of the wafer W on the spin chuck 62 from the discharge nozzle 64, and the resist solution is spread over to coat the wafer W by rotating the spin chuck 62 in the coating unit C like this.

Further, the developing unit D is structured almost the same with the coating unit C, whereas in the developing unit D, the discharge nozzle 64 is structured to include a plurality of supply holes arranged, for example, in a diameter direction of the wafer W, a developing solution as the processing solution is discharged onto the surface of the wafer W on the spin chuck 62 from the discharge nozzle 64, and the developing solution is heaped up on the wafer W by half rotating the spin chuck 62 so that a solution film of the developing solution is formed.

Moreover, the process units U are spatially closed. Namely, as shown in FIG. 5, the coating unit C or the like is partitioned off from other areas by a wall section 67 and a partition wall 68 partitions each section such as the coating unit C1 and the developing unit D1, and a delivery port 60 is formed at a position corresponding to the arm 71 of the substrate transfer device MA.

Furthermore, the air which is rid of the impurity, adjusted to a predetermined temperature, for example, to 23° C. as a coating temperature of the processing solution and to a predetermined humidity is flowed into each section of the coating processing section 5 which is partitioned off by the wall section 67 and the partition wall 68, whereby these areas have, so to speak, the atmosphere which is adjusted with high accuracy.

Namely, for example as shown in FIG. 5, in the partitioned process unit U, a filter unit F is provided to cover the upper side thereof, and the atmosphere collected from the lower side of the process unit U is exhausted to a plant exhaust system, while a part thereof is introduced to a filter device 69, and the air cleaned by the filter device 69 is blown out as a down flow through the aforesaid filter unit F into each section.

The aforesaid filter unit F includes, for example, a filter for cleaning the air, a chemical filter added with an acidic component for removing alkali components in the air such as an ammoniacal component and an amine, a suction fan and so on. Further, the aforesaid filter device 69 includes an impurity removing part for removing the impurity, a heating mechanism, a humidifying mechanism, a flowing out part for flowing out the air and so on. When, for example, a chemically amplified resist is used as the resist solution, it is necessary to prevent the alkali component from getting into the developing processing atmosphere, and hence the process section is spatially closed to prevent entrance of the alkali component from the outside by using the chemical filter.

It should be noted that the chemically amplified resist forms an acid by exposing, and the acid is diffused by the heating processing to act as a catalyst which decomposes a base resin as a main component of a resist material and changes its molecular structure to become soluble in the developing solution. Therefore, when this kind of resist is used, it is necessary to remove the alkali component because acid catalysis is retarded if the alkali component such as a trace quantity of ammonia included in the air and the amine produced from a wall coating contacts with the acid on the resist surface to deteriorate a shape of a pattern.

Figure 6:
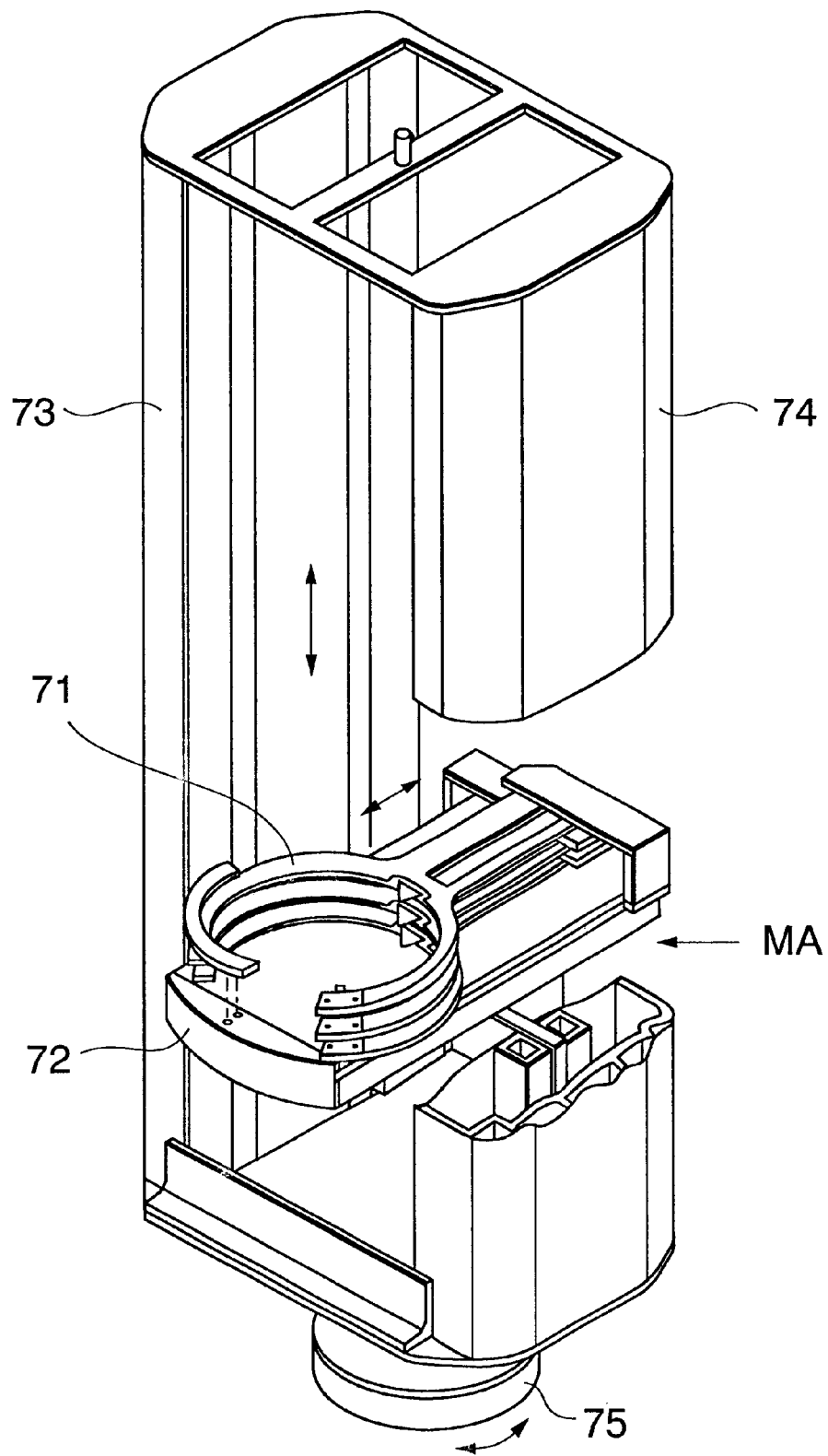
FIG. 6 is a sectional view of a substrate transfer device.

The aforesaid substrate transfer device MA includes, for example as shown in FIG. 6, the three arms 71 for holding the wafer W, a base table 72 for supporting the arm 71 to be movable in back and forth, a pair of guide rails 73, 74 for supporting the base table 72 to be ascendable and descendable, and it is structured to be movable in back and forth, ascendable and descendable, and rotatable around a vertical axis by rotating these guide rails 73, 74 by a rotation drive portion 75.

The interface station S3 is connected next to the process station S2, and the exposure unit S4 for exposing the wafer W formed with a resist film is connected to the back side of the interface station S3. The interface section S3 includes the delivery arm 24 for delivering the wafer W between the process station S2 and the exposure unit S4.

Next, an operative sequence of the above-described embodiment will be explained. First, an automatic transfer robot (or an operator) carries the cassette 22 housing, for example, the 25 wafers W onto the cassette stage 21 and the wafer W is removed from the cassette 22 by the delivery arm 23 to be placed in the delivery section 53 in the shelf unit R1 of the process station S2.

The wafer W is transferred to the hydrophobic section 52 in the shelf unit R by the substrate transfer device MA to make the surface of the wafer W hydrophobic, and then transferred to the cooling section 4 in the shelf unit R by the substrate transfer device MA to be cooled to a set temperature based on the temperature of the transfer area. Subsequently, the wafer W is transferred to the coating unit C by the substrate transfer device MA to be coated with the resist solution.

Here, the temperature adjustment of the wafer W will be explained because a feature of the present invention is to adjust the temperature of the wafer W in the cooling section 4 based on the temperature of the transfer area. In this example, the temperature of the transfer area is detected by the temperature/humidity detector 3 in a predetermined timing, and the control section 30 controls the temperature of the cooling plate 41 in the cooling section 4 based on the detected value, for example as described above, to make the temperature of the wafer W when transferred to the coating unit C become 23° C. if the coating temperature of the processing solution in the coating unit C is 23° C., which makes it possible to adjust the temperature of the wafer W to a predetermined temperature.

Figure 7A:
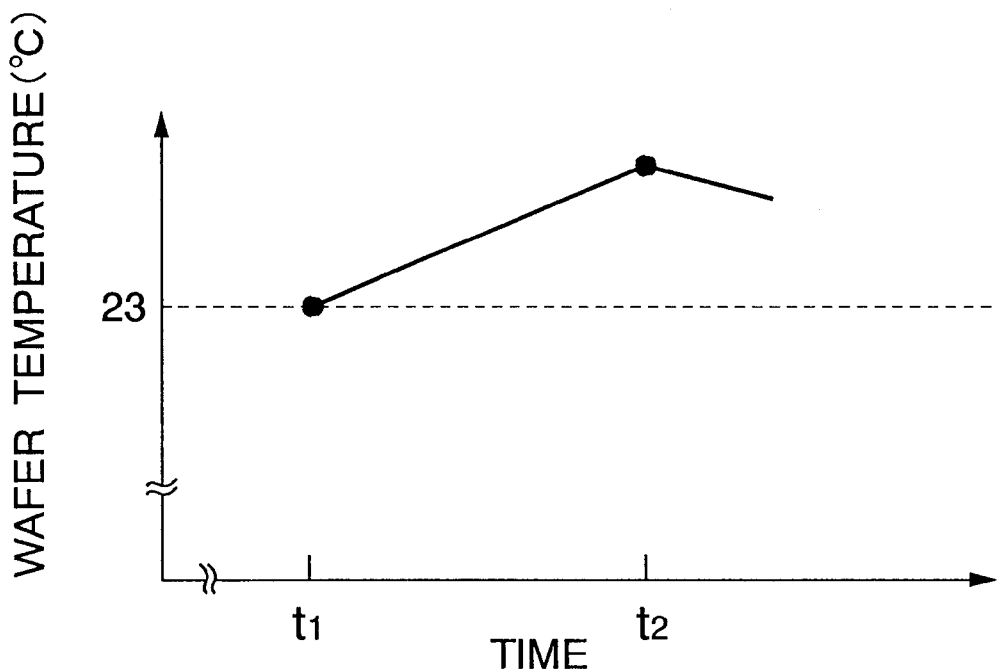
FIG. 7A and FIG. 7B are characteristic views explaining a method of the present invention.

Namely, when the wafer w is transferred after its temperature is adjusted to 23° C. in the cooling section 4 as is conventional, which takes 2 to 3 seconds, turbulence due to the movement of the substrate transfer device MA flows against the wafer W, whereby the temperature of the wafer W changes in a short time and is influenced by the temperature of the transfer area, and, for example, in the case where the temperature of the transfer area is higher than 23° C., the wafer temperature when transferred to the coating unit C becomes higher than 23° C. as shown in FIG. 7A. Incidentally, the temperature of the coating unit C is adjusted, and hence the temperature of the wafer W gets closer to 23° C. gradually as the coating processing progresses.

Figure 7B:
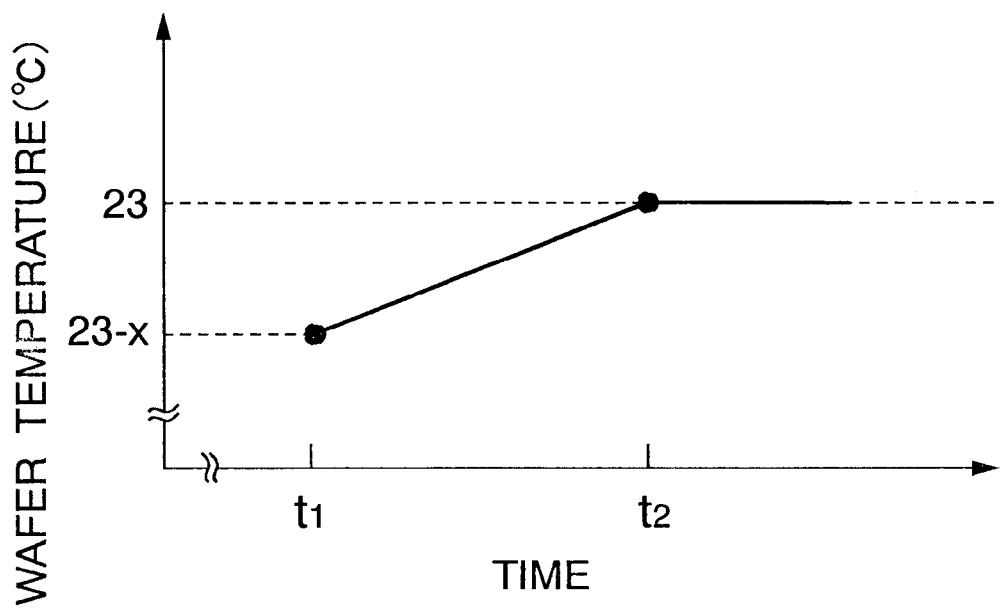

Therefore, in this example, the temperature of the cooling plate 41 in the cooling section 4 is corrected by the control section 30 so that the wafer temperature becomes 23° C. when transferred to the coating unit C, according to the changing range of the wafer temperature during the transfer, which is decided based on the temperature of the transfer area and the transfer time. For example as shown in FIG. 7B, when the temperature of the wafer W rises x° C. during the transfer, the wafer temperature is adjusted to, for example, (23−x)°C in the cooling section 4 so that the wafer temperature becomes 23° C. when transferred to the coating unit C.

Figure 8A:
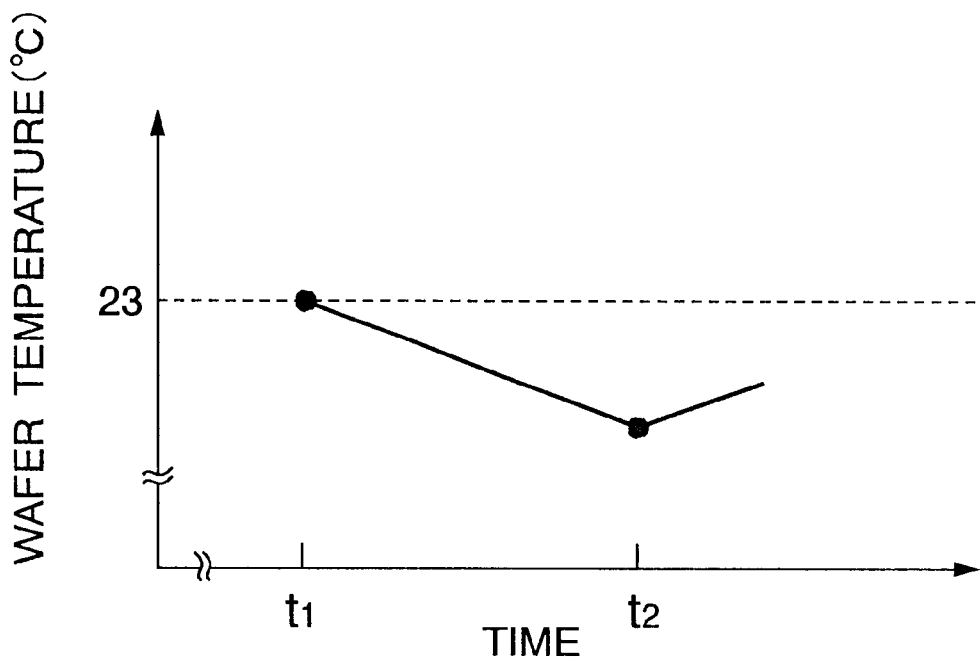
FIG. 8A and FIG. 8B are characteristic views explaining a method of the present invention.
Figure 8B:
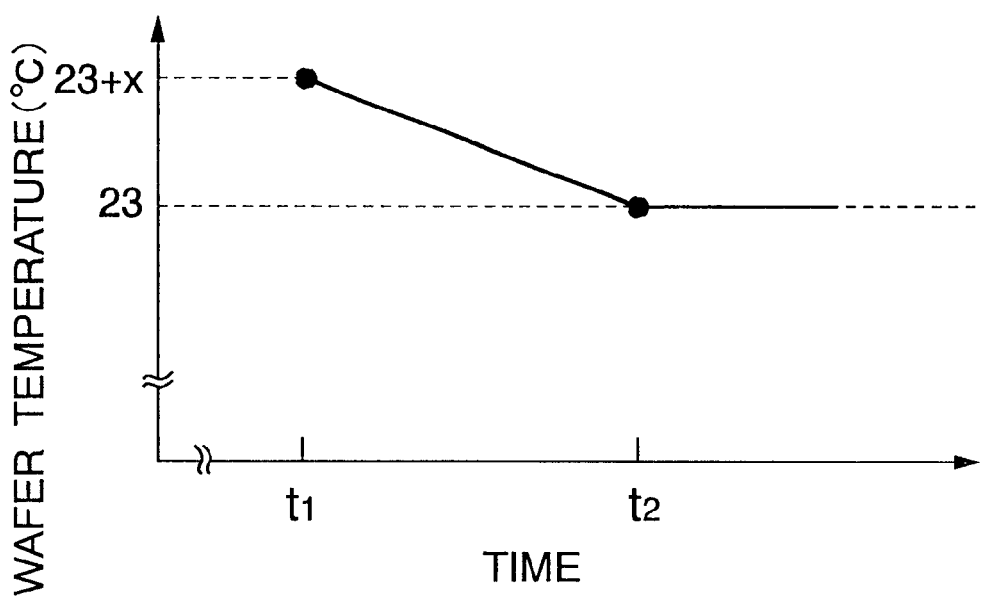

Meanwhile, in the case where the temperature of the transfer area is lower than 23° C., the wafer temperature when transferred to the coating unit C becomes lower than 23° C. as shown in FIG. 8A when the wafer W is transferred to the cooling section 4 after its temperature is adjusted to 23° C. as is conventional. (Incidentally, as already described, the temperature of the wafer W gets closer to 23° C. gradually as the coating processing progresses.) Therefore, in this example, when, for example, the temperature of the wafer W lowers x° C. during the transfer, the wafer temperature is adjusted to, for example, (23+x)°C. in the cooling section 4 so that the wafer temperature becomes 23° C. when transferred to the coating unit C.

The temperature of the wafer W which changes during the transfer is decided based on the temperature of the transfer area and the transfer time. Further, the transfer time is decided by the position of the cooling section 4 in the shelf unit R, the position of the coating unit C, the transfer speed of the substrate transfer device MA, the timing of the transfer and so on. Therefore, the transfer time is obtained beforehand according to a series of the processing programs, a correction value of the temperature of the cooling plate 41 in the cooling section 4 is obtained accordingly based on the temperature of the transfer area and the transfer time, and the correction value is memorized in the control section 30, so that the temperature of the cooling plate 41 in the cooling section 4 is controlled based on the temperature of the transfer area and the transfer time, and the wafer W the temperature of which is thereby controlled to a predetermined temperature becomes 23° C. when transferred to the coating unit C by the substrate transfer device MA.

Incidentally, the temperature of the cooling plate 41 may be compensated according to the humidity detected by the temperature/humidity detector 3, not to the temperature of the transfer area like this. For example, since a CD (line width) value decreases when the humidity is high and the CD value increases when the humidity is low, the temperature may be compensated to make the CD value increase when the humidity is lower than the desired value, and the temperature may be compensated to make the CD value decrease when the humidity is higher than the desired value. Of course the humidity of the transfer area may be controlled to become the desired humidity according to the detected humidity by the temperature/humidity detector 3.

The wafer W which is thus coated with the resist solution at the predetermined temperature, for example, at 23° C. is transferred to the heating section 51 in the shelf unit R by the substrate transfer device MA to be heated to a predetermined temperature, then transferred to the cooling section 4 in the shelf unit R by the substrate transfer device MA to be subjected to the temperature adjustment by being cooled to a predetermined temperature, and subsequently, transferred by the route of the delivery arm 24 of the interface section S3→the exposure unit S4 to be exposed.

The exposed wafer W is transferred by the reverse route, that is the exposure unit S4→the delivery arm 24→the heating section 51 in the shelf unit R→the substrate transfer device MA→the cooling section 4 in the shelf unit R→the substrate transfer device MA→the developing unit D. Thus, the wafer W is heated to a predetermined temperature in the heating section 51, subjected to the temperature adjustment with high accuracy by being cooled to a predetermined temperature by the cooling section 4 based on the temperature in the transfer area, and then the wafer W undergoes the developing processing in the developing unit D at a predetermined temperature, for example, 23° C. which is the coating temperature of the processing solution. The temperature adjustment of the wafer W based on the temperature of the transfer area is performed in the cooling section 4 in the process of the cooling section 4→the developing unit D, similarly to the process of the cooling section 4→the coating unit C.

Subsequently, the wafer W is transferred by the route of the substrate transfer device MA→the heating section 51 in the shelf unit R→the substrate transfer device MA→the cooling section 4 in the shelf unit R→the substrate transfer device MA→the delivery section 53 in the shelf unit R→the delivery arm 23, in which the wafer W, which is heated to a predetermined temperature and then cooled to a predetermined temperature is returned back, for example, to the original cassette 22 through the delivery section 53.

In the process station S2, the wafer W is successively sent to the delivery section 53 in the shelf unit R, and then transferred by the route of the vacant hydrophobic section 52→the vacant cooling section 4 in the shelf unit R→the vacant coating unit C→the vacant heating section 51 in the shelf unit R→the vacant cooling section 4 in the shelf unit R the interface station S3, and the exposed wafer W should be transferred by the route of the delivery arm 24 of the interface station S3→the vacant heating section 51 in the shelf unit R→the vacant cooling section 4 in the shelf unit R→the vacant developing unit D→the vacant heating section 51 in the shelf unit R→the vacant cooling section 4 in the shelf unit R→the delivery section 53.

In this example, each of the temperature/humidity detectors 3A, 3B, 3C is respectively provided among the three shelf units R1, R2, R3 and the substrate transfer device MA, which controls the temperature of the cooling plate 41 in the cooling section 4 in the shelf unit R1 based on the detected value of the temperature/humidity detector 3A when the wafer W is transferred between the shelf unit R1 and the process unit U, controls the temperature of the cooling plate 41 in the cooling section 4 in the shelf unit R2 based on the detected value of the temperature/humidity detector 3B when the wafer W is transferred between the shelf unit R2 and the process unit U, and controls the temperature of the cooling plate 41 in the cooling section 4 in the shelf unit R3 based on the detected value of the temperature/humidity detector 3C when the wafer W is transferred between the shelf unit R3 and the process unit U.

In the aforesaid embodiment, the temperature of the transfer area is detected and the wafer temperature is adjusted based on the detected value by controlling the temperature of the cooling plate 41 in the cooling section 4 to make the temperature of the wafer W become a predetermined temperature when the wafer W is transferred to the process unit U, so that the resist coating and the developing can be performed at a predetermined temperature, a change of a film thickness and a developing line width due to the temperature change can be prevented, and a uniform processing can be performed without the formation of an uneven color.

In this embodiment described above, the number and the attaching position of the temperature/humidity detectors 3 are not limited to the above example, which may be attached near the process units U and may be prepared for the respective cooling sections 4, as long as they can detect the temperature of the transfer area.

Further, the layout and the number of the process units U and the cooling sections 4 are not limited to the above example, and it may be so structured, for example, that a cooling section 4 for controlling the temperature with high accuracy is exclusively provided before the processing in the coating unit C and the developing unit D, which is multi-tiered vertically with the coating unit C, the developing unit D or the like, and that a shelf unit R may be exclusively provided for this cooling section 4 which controls the temperature with high accuracy, in which cases, there is an advantage that the decision of the correction value of the temperature of the cooling plate 41 becomes easier because of the almost same transfer time.

Further, the cooling section 4 may be so structured that the wafer W is cooled by circulating a refrigerant in the cooling plate 41, in which case the temperature of the wafer W is controlled with high accuracy by adjusting the circulation amount and the temperature of the refrigerant. Moreover, it may be so structured that the cooling plate 41 and the heating plate (not shown) are provided by being multi-layered and the temperature adjustment is performed by a combination thereof. Furthermore, the correction value of the temperature of the cooling plate 41 may be decided with the constant transfer time by making the temperature control parameter in the control section only for the temperature.

Figure 9A:
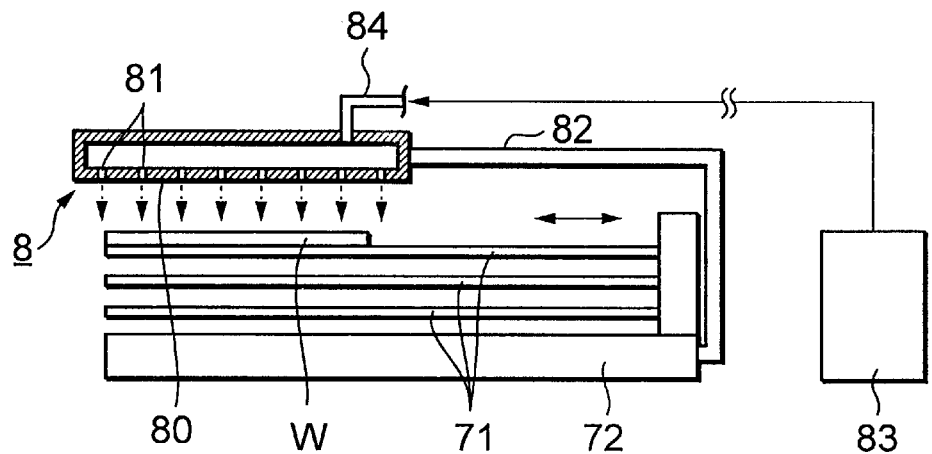
FIG. 9A and FIG. 9B are a sectional view and a perspective view of a coating and developing unit according to another embodiment of the present invention.
Figure 9B:
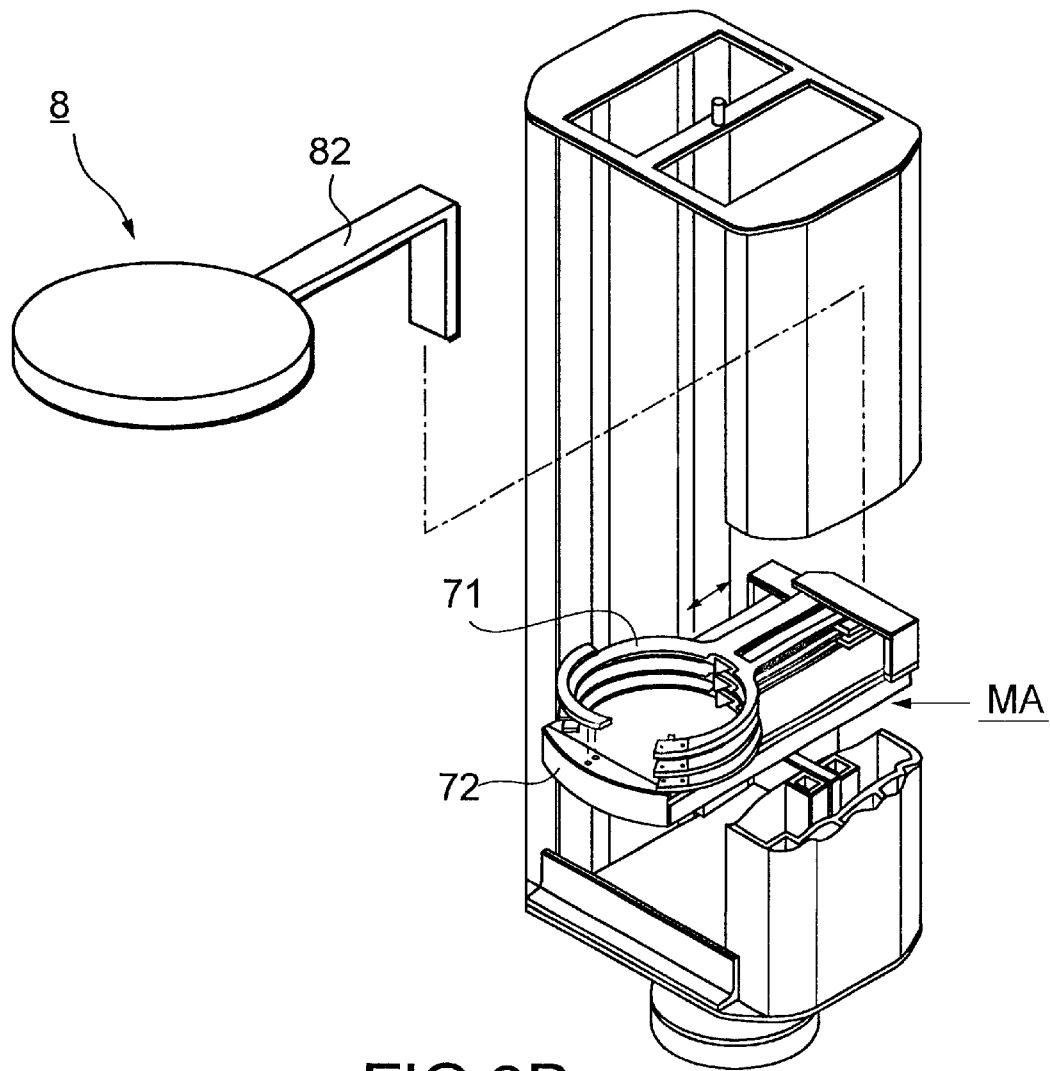
Figure 10:
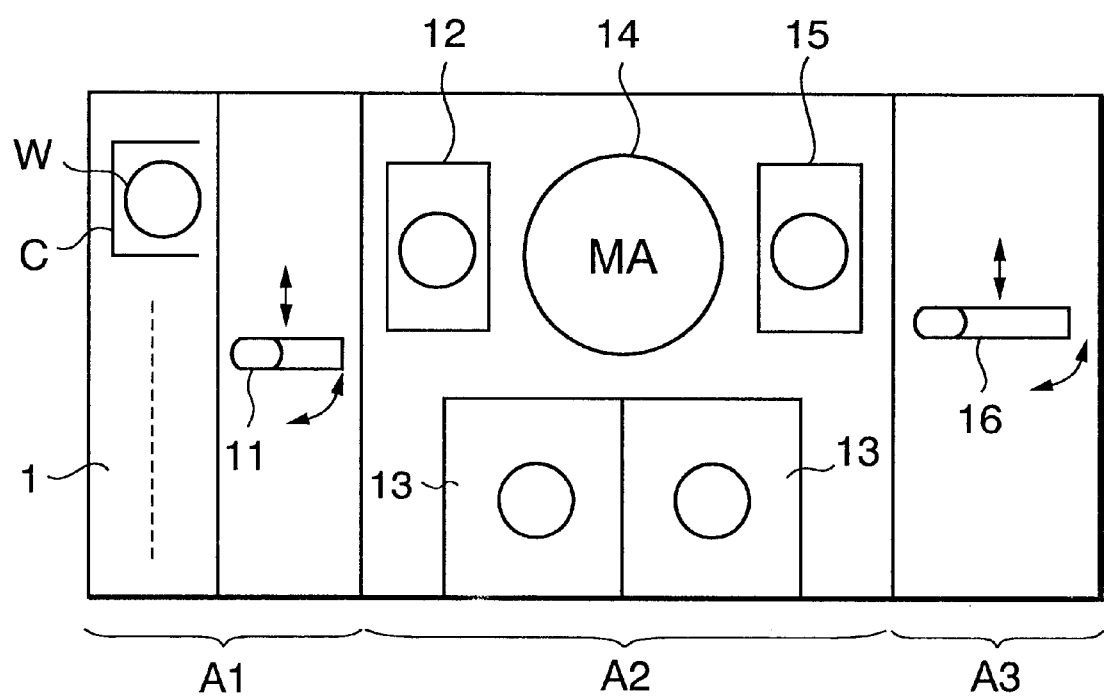
FIG. 10 is a schematic plane view of a conventional coating and developing unit.
Figure 11:
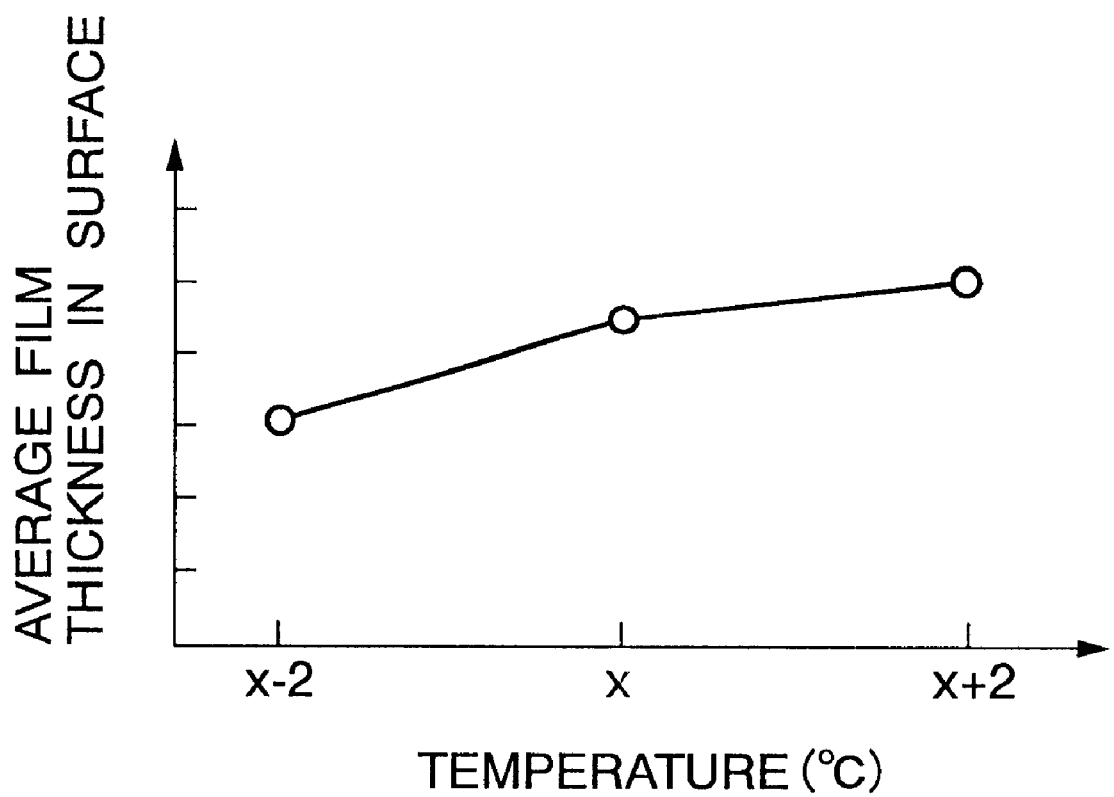
FIG. 11 is a characteristic view of a temperature dependency of a film thickness.
Figure 12:
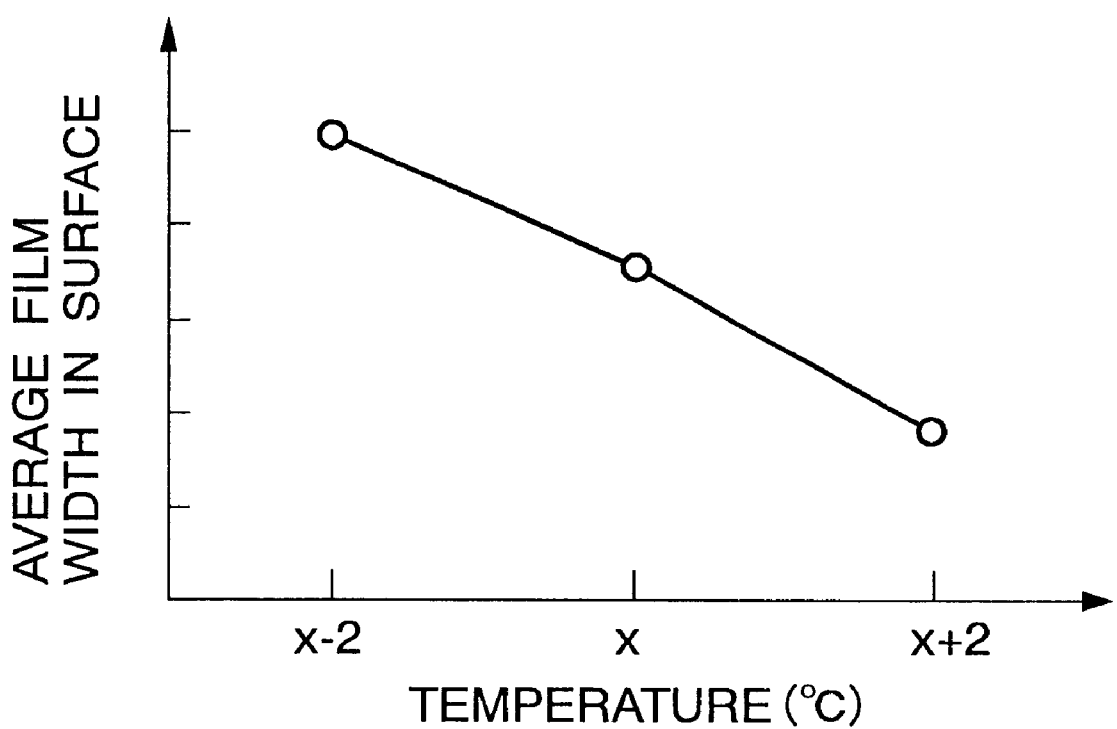
FIG. 12 is a characteristic view of a temperature dependency of a developing line width.

Next, another example of the present invention will be explained with reference to FIG. 9A and FIG. 9B. In this embodiment, the wafer W is transferred in the transfer area while the gas which is adjusted to a predetermined atmosphere is supplied onto the wafer W in order to prevent the temperature change during its transfer. In concrete, as shown in FIG. 9A and FIG. 9B, in the aforesaid substrate transfer device MA, for example, an uppermost arm 71 is used only for the transfer among the cooling plate 41 and the coating unit C or the developing unit D, and a gas supply part 8 for supplying the gas adjusted to a predetermined atmosphere onto the wafer W supported by the arm 71 is provided on the upper side of the arm 71.

The gas supply part 8 is in a shape of, for example, a flat cylinder, and attached to the back surface of the aforesaid base table 72 (back surface of the arm 71 in a movement direction) by the supporting arm 82 so that an opening surface 80 provided with a plurality of gas supply holes 81 opposes the wafer W on the aforesaid arm 71. The opening surface 80 of the aforesaid gas supply part 8 is set to have a enough size to be able to supply the air to the larger area than the wafer W supported by the arm 71.

In the gas supply part 8 like this, the gas, for example, the air which is rid of the impurity and adjusted to a predetermined temperature, for example, to 23° C. as the coating temperature of the process solution and to a predetermined humidity is supplied from a filter device 83 through a gas supply pipe 84, whereby the air is flown onto the wafer W held by the arm 71 through the gas supply holes 81. The aforesaid filter device 83 includes an impurity removing part for removing the impurity, a heating mechanism, a humidifying mechanism, a flowing out part for flowing out the air and so on.

In this kind of embodiment, the wafer W is less influenced by the temperature of the transfer area because the air which is adjusted to the coating temperature of the processing solution in the coating processing section is supplied onto the wafer W when the wafer W is transferred from the cooling section 4 to the coating unit C or from the cooling section 4 to the developing unit D by the substrate transfer device MA. Therefore, the wafer W can be transferred to the process unit U while maintaining its temperature which is adjusted to the coating temperature of the process solution in the cooling section 4 with high accuracy, which makes it possible to perform the coating processing and the developing processing at a predetermined temperature, and to perform a uniform processing without the formation of an uneven processing due to the temperature change.

In this example, as the gas supplied onto the wafer W, inert gases such as nitrogen or the like can be used besides the air. Further, the gas supply part 8 may be structured, not to be integrally attached to the substrate transfer device MA, but to be separately provided so as to supply the gas onto the wafer W held by the arm 71.

Moreover, a temperature/humidity sensor may be attached inside the coating unit C to detect the temperature and the humidity inside the coating unit C so that the gas of the almost same temperature and humidity with that in the coating unit C is supplied onto the wafer W held by the arm 71. Incidentally, in this case, it is possible to compensate the temperature, not to control the humidity. For example, since a CD (line width) value decreases when the humidity is high and the CD value increases when the humidity is low, the temperature may be compensated to make the CD value increase when the humidity is lower than the desired value, and the temperature may be compensated to make the CD value decrease when the humidity is higher than the desired value. Of course it is possible to undergo its reverse operational sequences, that is, to control the humidity only, not compensating the temperature.

Further, the example in which the wafer W is transferred while supplying the gas adjusted to a predetermined temperature thereon and the example in which the temperature of the cooling section 4 is controlled based on the temperature of the aforesaid transfer area may be combined, in which case the temperature of the cooling plate 41 in the cooling section 4 is controlled in consideration of supplying the air with the processing temperature onto the wafer W during the transfer.

In the present invention described above, an anti-reflection film may be formed on the surface of the wafer W before coating the resist, instead of the hydrophobic processing. In this case, since the wafer W is cooled to a predetermined temperature before the formation of the anti-reflection film, a unit for forming the anti-reflection film is added to the process unit U, and, for example, when the wafer W is transferred to the unit for forming the anti-reflection film based on the temperature of the transfer area, the temperature of the cooling section 4 is controlled based on the temperature of the transfer area so that the temperature of the wafer W becomes that for performing the processing.

Incidentally, the anti-reflection film is formed to prevent the reflection which occurs in the lower side of the resist in the exposure when the chemically amplified resist is used. Further, in the present invention, the substrate is not limited to the wafer, and may be a glass substrate for a liquid crystal display.

Next, another embodiment of the present invention will be explained.

Figure 13:
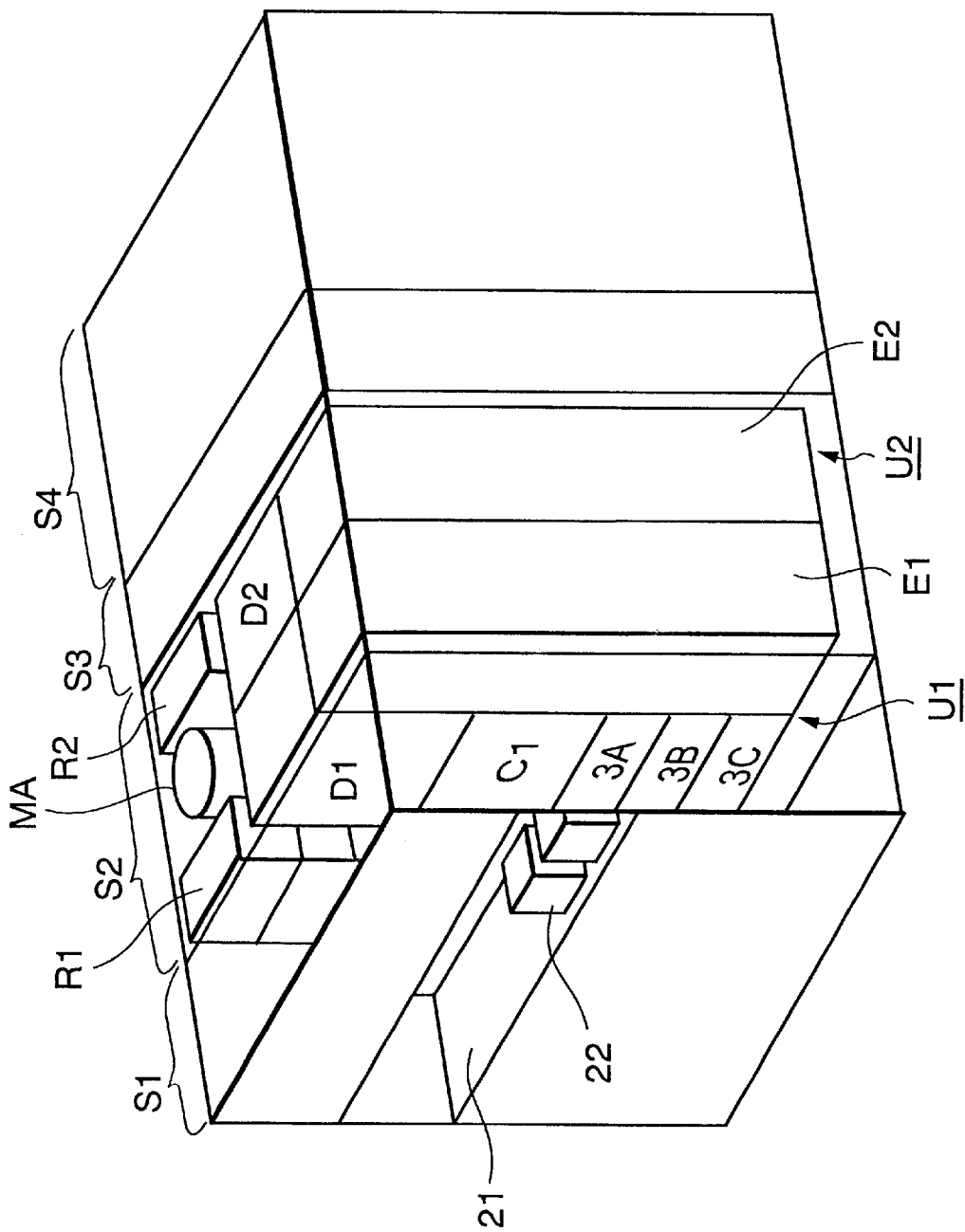
FIG. 13 is a perspective view of a coating and developing unit according to another embodiment of the present invention.
Figure 14:
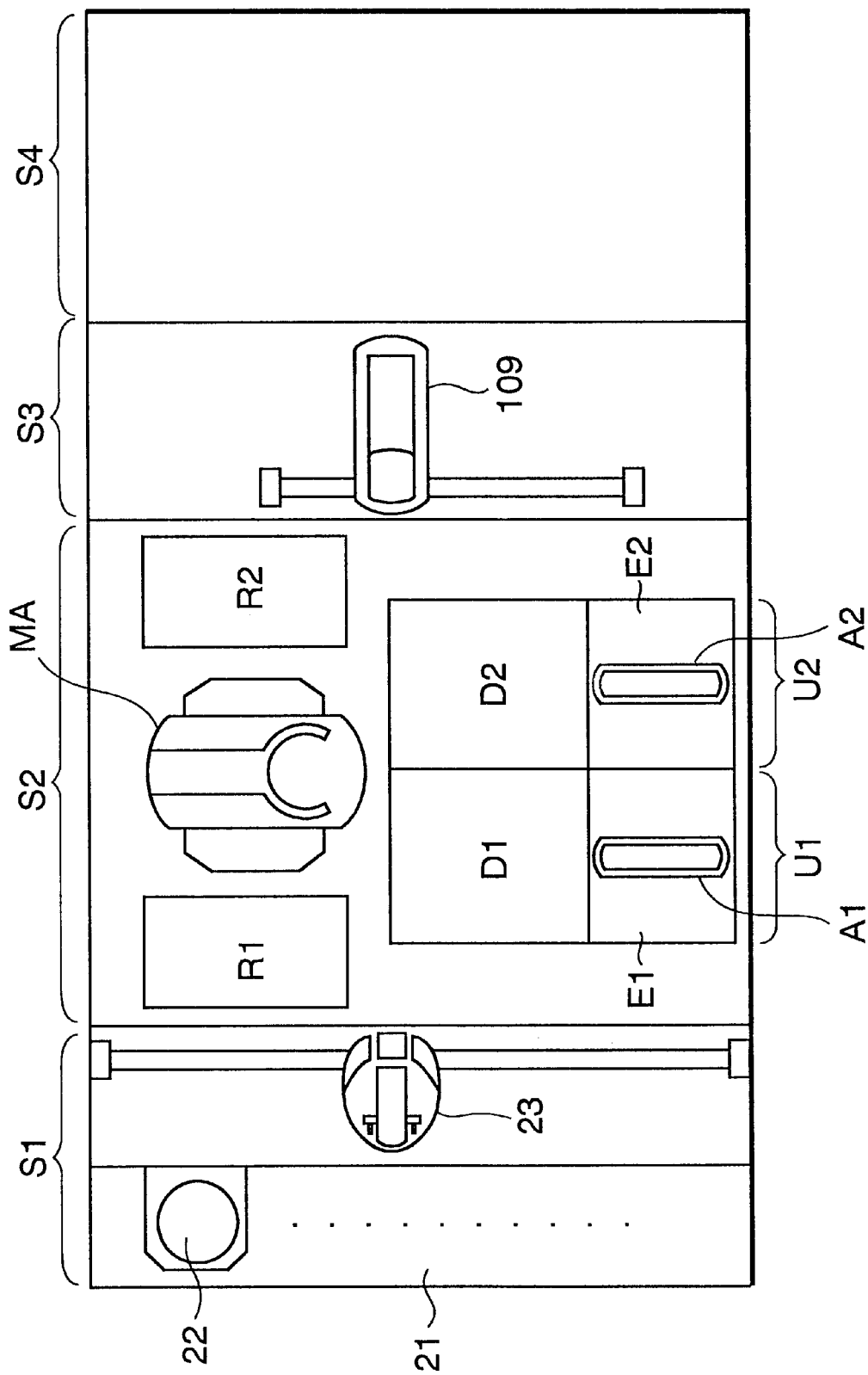
FIG. 14 is a schematic plane view of the coating and developing unit.

FIG. 13 is a perspective view showing an interior of this embodiment seen through, FIG. 14 is a schematic plane view. The same numerals are used in the figures to designate the same components with those in the first embodiment. S1 is a cassette station, S2 is a process station for performing a coating processing of a resist and a developing processing on a wafer W, S3 is an interface station, and S4 is an exposure unit.

The cassette station S1 includes a cassette stage 21 as a mounting portion which mounts a cassette 22 and a delivery arm 23.

Further, the process station S2 includes, for example, two coating units C (C1, C2), for example, two developing units D (D1, D2), for example, two shelf units R (R1, R2), for example, six cooling sections 3 (3A, 3B, 3C, 3D, 3E, 3F, 3G), for example, two transfer arms A (A1, A2) as exclusive transfer means for transferring the wafer W among the coating units C or the developing units D and the cooling sections 3 and, for example, one substrate transfer device MA, and is structured to deliver the wafer W between the cassette station S1 and the interface station S3, and to perform a coating processing of a resist solution on the wafer W, a developing processing of the wafer W, and a heating/cooling processing of the wafer W to a predetermined temperature before/after these processings in the station S2.

In explanation of an example of a layout inside the process station S2, for example, two process units U (U1, U2) including a coating processing section such as the coating unit C and the developing unit D, the cooling sections 3, the transfer arm A, transfer areas E exclusive to the transfer arms A are provided side by side in a direction perpendicular to an alignment direction of the cassette on the cassette station S1 with the process unit U1 on the front side. Incidentally, in the following explanation, the cassette station S1 side is referred to as the front side and the exposure unit S4 side is referred to as the back side.

Moreover, on the left side of the process units U as seen from the cassette station S1, the shelf unit R1 is provided on the front side and the shelf unit R2 is provided on the back side, respectively. Furthermore, on the left side of the process unit U as seen from the cassette station S1, the substrate transfer device MA is disposed to be accessible to the respective sections of the process units U and the shelf units R.

Figure 15:
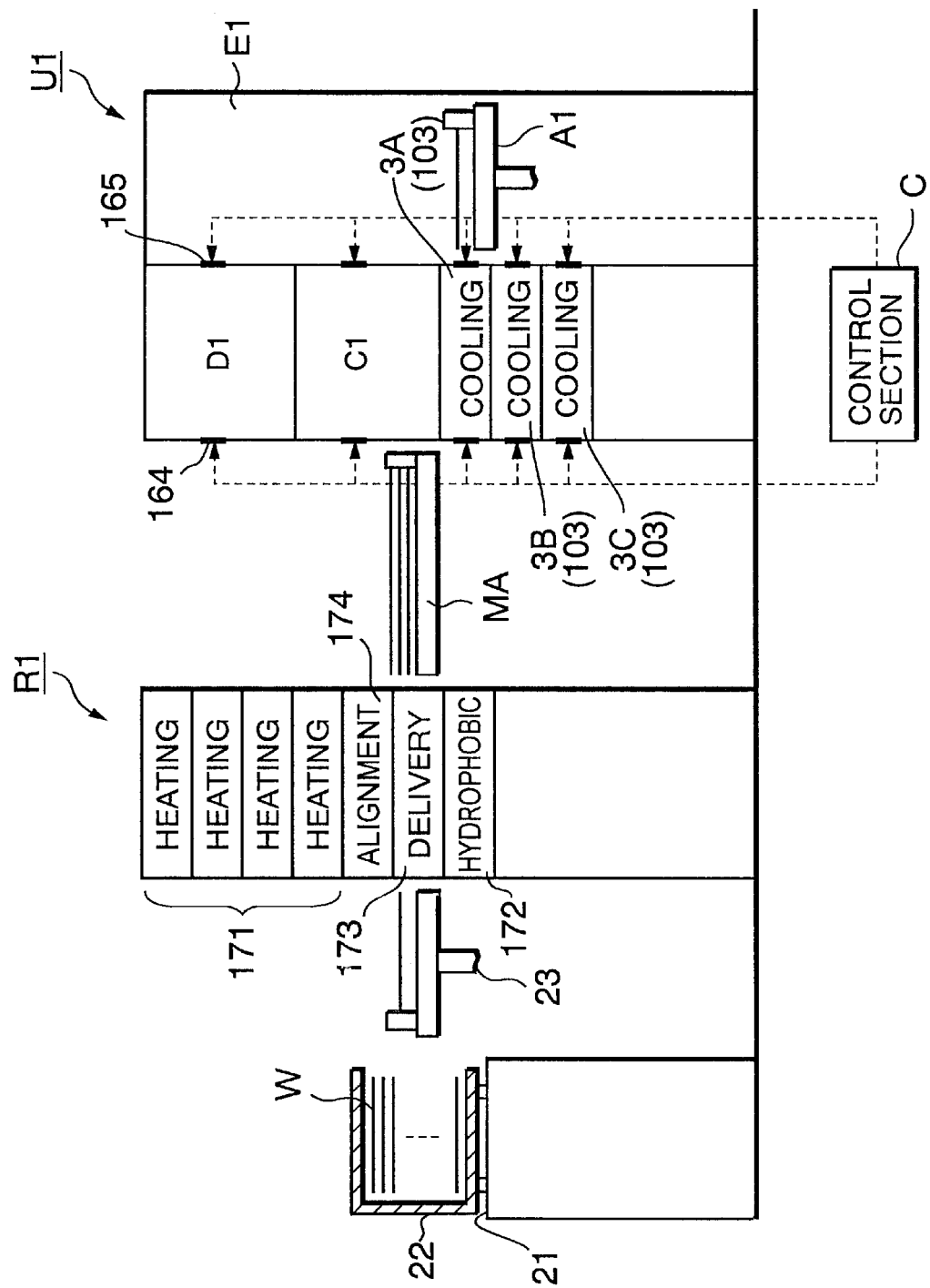
FIG. 15 is a side view of an example of a shelf unit and a process unit of the coating and developing unit.

In explanation of the aforesaid process units U, for example, in the process unit U1, as shown in FIG. 15, one developing unit D1, one coating unit C1, three cooling sections 3A, 3B, 3C are arranged from the top in this order. On the back side of these units as seen from the substrate transfer device MA (the opposite side to which the substrate transfer device MA is getting access), the transfer arm A1 is provided for transferring the wafer W among them, where a transfer area E1 which is exclusive to the transfer arm A1 is formed.

Figure 16:
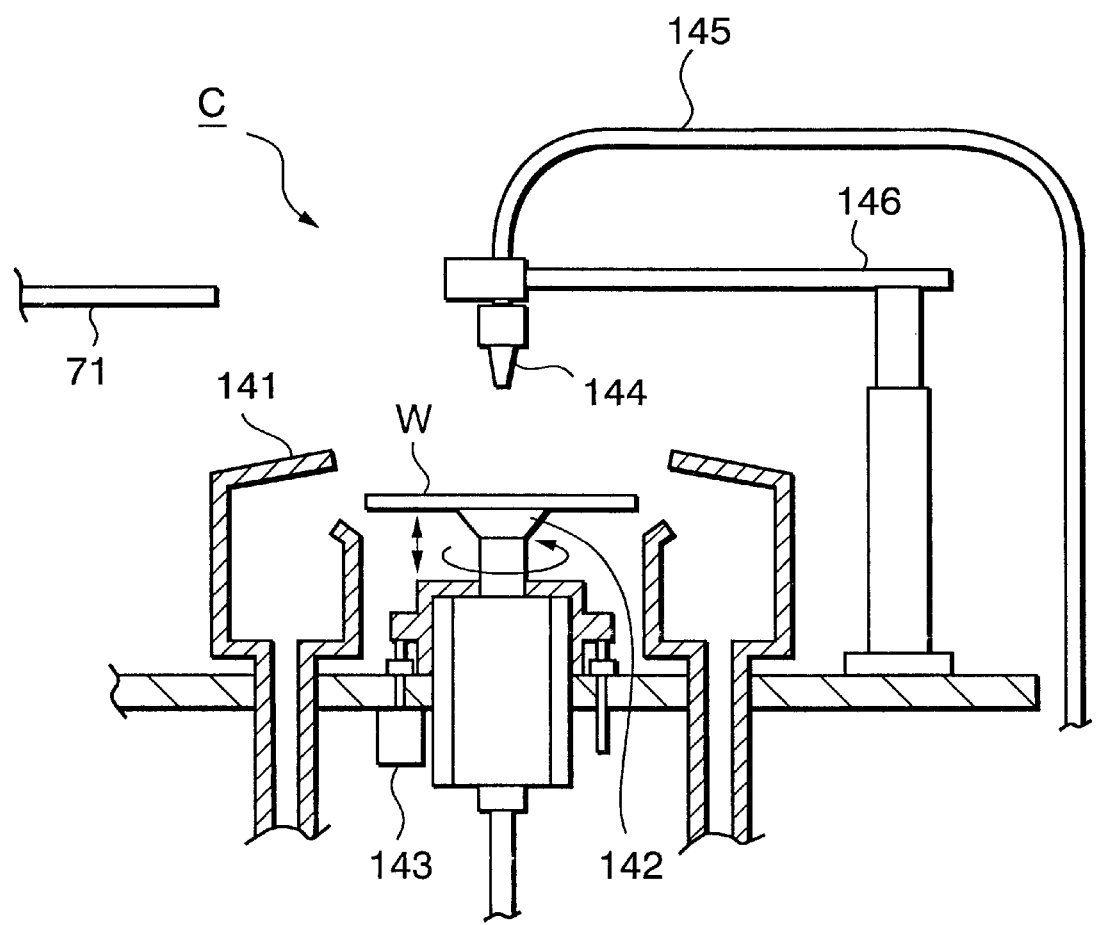
FIG. 16 is a sectional view of an example of a coating unit of the coating and developing unit.

The aforesaid coating unit C is explained based on, for example, FIG. 16, in which a cup is shown as number 141, and a spin chuck 142 which has a function of vacuum sucking is provided rotatably inside the cup 141. The spin chuck 142 is structured to be ascendable and descendable by a raising and lowering mechanism 143, and when it is positioned in the upper side of the cup 141, the wafer is delivered to the later-described arm 181 of the aforesaid substrate transfer device MA.

Regarding the delivery of the wafer W, the wafer W on the arm 71 is delivered to the spin chuck 142 on the upper side of the cup 141, to which it is relatively raised from its lower side, and delivered from the spin chuck 142 side to the arm 71 by the reverse operative sequences. A discharge nozzle is shown as number 144, a processing solution supply pipe is shown as number 145, and a supporting arm for moving the nozzle horizontally is shown as number 146, in which the resist solution as the processing solution is dropped onto the surface of the wafer W on the spin chuck 142 from the discharge nozzle 144, and the resist solution is spread over to coat the wafer W by rotating the spin chuck 142 in the coating unit C like this.

Further, the developing unit D is structured almost the same with the coating unit C, whereas in the developing unit D, the discharge nozzle 144 is structured to include a plurality of supply holes arranged, for example, in a diameter direction of the wafer W, a developing solution as the processing solution is discharged onto the surface of the wafer W on the spin chuck 142 from the discharge nozzle 144, and the developing solution is heaped up on the wafer W by half rotating the spin chuck 142 so that a solution film of the developing solution is formed.

Figure 17:
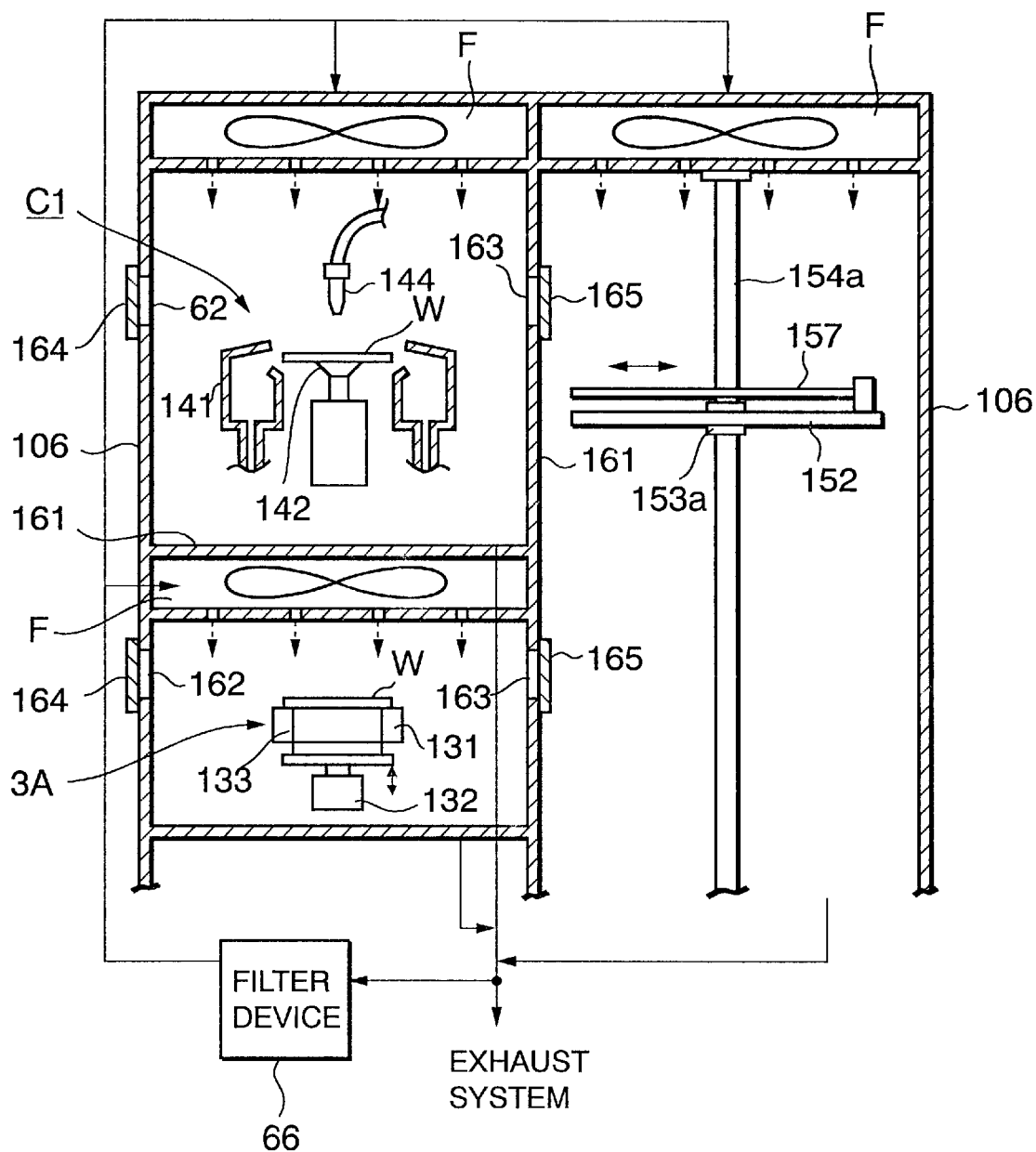
FIG. 17 is a sectional view partially showing the process unit.

In the aforesaid cooling section 3, for example as shown in FIG. 17, the wafer W is mounted on the surface of a cooling plate 131 (see FIG. 5) in which, for example, a thermo module is embedded to thereby cool the wafer W to a predetermined temperature. A raising and lowering pin 133 which is raised and lowered by a raising and lowering mechanism 132 is provided on the cooling plate 131 in order to deliver the wafer W to the plate 131.

Figure 18:
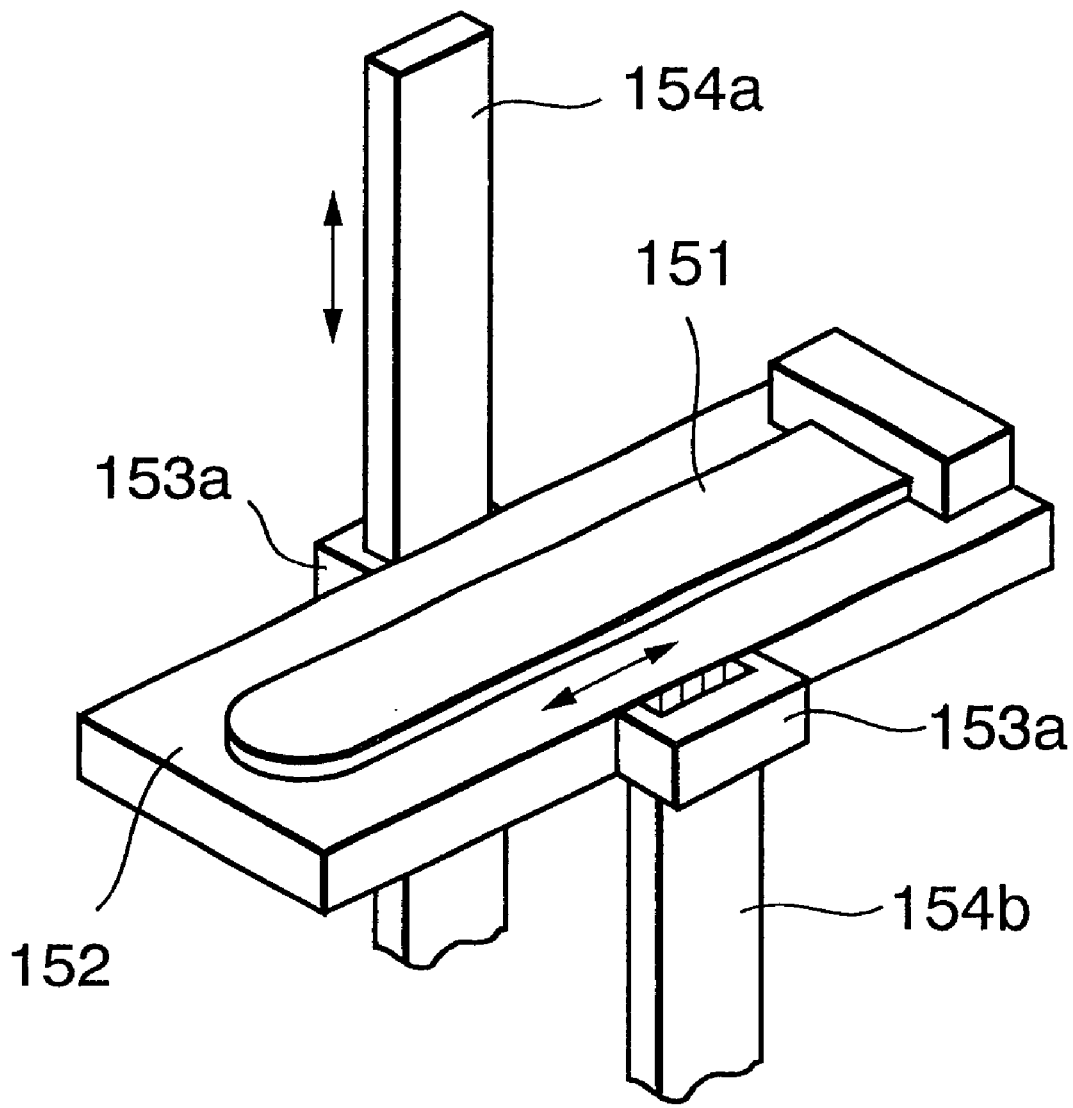
FIG. 18 is a perspective view of a delivery arm.

The aforesaid transfer arm A is so structured, for example as shown in FIG. 17 and FIG. 18, that an arm 151 for holding the wafer W moves back and forth along a base table 152 and the base table 152 itself is supported by supporting members 153a, 153b to be ascendable and descendable along guide rails 154a, 154b which are integral therewith. The arm 151 is thus structured to be movable in back and forth and ascendable and descendable, accesses to the coating unit C1, the developing unit D1 and the cooling sections 3A, 3B, 3C from the opposite side to which the substrate transfer device accesses, and delivers the wafer W among them.

Figure 19:
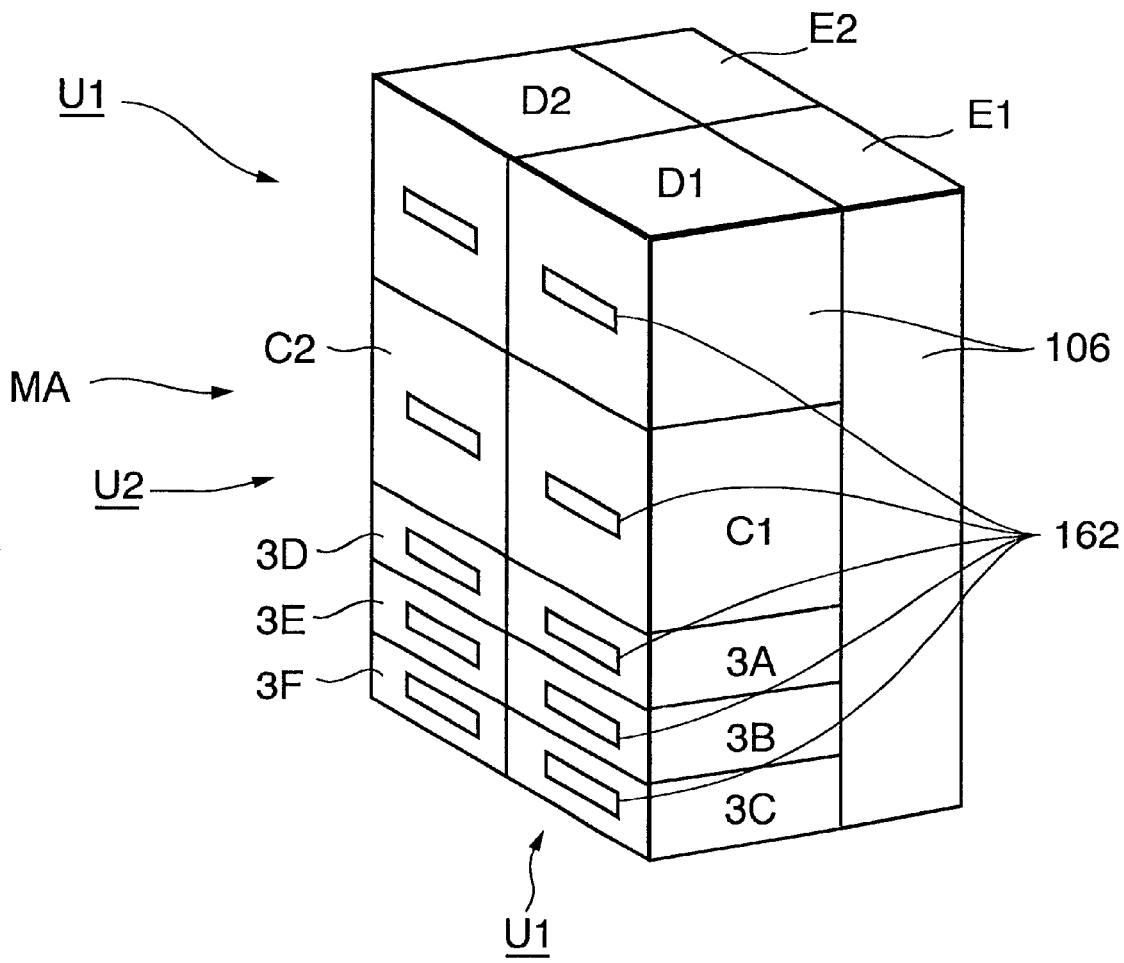
FIG. 19 is a perspective view of the process unit.

Moreover, the coating unit C1, the developing unit D1, the cooling sections 3A, 3B, 3C, and the transfer area E1 of the transfer arm A1 are spatially closed. Namely, as shown in FIG. 17 (It should be noted that the coating unit C1 and the cooling section 3A are layered and the coating unit C1 is positioned at the uppermost section of the process unit U1 for explanatory convenience.) and FIG. 19, the front side (the opposing side to the substrate transfer device MA), the back side, the lateral side of the coating unit C1 and so on and the transfer area E1 of the transfer arm A1 are partitioned off from other areas by a wall section 106 and a partition wall 161 partitions each section such as the coating unit C1 and the developing unit D1. Thus, in this example, the transfer area E1 which is exclusive to the transfer arm A1 for transferring the wafer W between the coating processing section such as the coating unit C1 and the cooling section 103 is formed adjacent to the aforesaid coating processing section and the like on the back side thereof.

At the position corresponding to the arm 71 of the substrate transfer device MA and at the position corresponding to the arm 151 of the transfer arm A1 in each section such as the coating unit C1 of the aforesaid wall section 106, a first delivery port 162 and a second delivery port 163 are respectively provided (see FIG. 20, FIG. 21), each of which is normally closed with lid portions 164, 165, and a control section C controls the timing of the open/close of the respective lid portions 164, 165.

Further, the air which is rid of the impurity, adjusted to a predetermined temperature, for example, to 23° C. and to a predetermined humidity is flowed into each section such as the coating unit C1 and so on and the transfer area E1 of the transfer arm A1 which are partitioned off by the wall section 106 and the partition wall 161, whereby these areas have, so to speak, the atmosphere which is adjusted with high accuracy.

Namely, for example, in the partitioned coating processing section such as the coating unit C1, the cooling section 103, and the transfer area E1 of the transfer arm A1, a fan filter unit (FFU) F in which a fan and a ULPA filter are structured integrally as shown in FIG. 17 is provided to cover the upper side of the respective sections, and the atmosphere collected from the lower side of each section is exhausted to a plant exhaust system, while a part thereof is introduced to a filter device 166, and the air cleaned by the filter device 166 is blown out as a down flow through the aforesaid fan filter unit F into each section.

The aforesaid fan filter unit F further includes, for example, a filter for cleaning the air, a chemical filter added with an acidic component for removing alkali components in the air such as an ammoniacal component and an amine, a suction fan and so on. Further, the aforesaid filter device 166 includes an impurity removing part for removing the impurity, a heating mechanism, a humidifying mechanism, a flowing out part for flowing out the air and so on. When, for example, a chemically amplified resist is used as the resist solution, it is necessary to prevent the alkali component from getting into the developing processing atmosphere, and hence the process section is spatially closed to prevent entrance of the alkali component from the outside by using the chemical filter.

It should be noted that the chemically amplified resist forms an acid by exposing, and the acid is diffused by the heating processing to act as a catalyst which decomposes a base resin as a main component of a resist material and changes its molecular structure to become soluble in the developing solution. Therefore, when this kind of resist is used, it is necessary to remove the alkali component because acid catalysis is retarded if the alkali component such as a trace quantity of ammonia included in the air and the amine produced from a wall coating contacts with the acid on the resist surface to deteriorate a shape of a pattern.

The aforesaid process unit U2 is structured similarly to the process unit U1, in which the developing unit D2, the coating unit C2, three cooling sections 3D, 3E, 3F are arranged from the top in this order, and on the back side of these as seen from the substrate transfer device MA, the transfer arm A2 which has an exclusive transfer area E2 is provided for transferring the wafer W among them.

As shown with the shelf unit R1 as a representative in FIG. 15, heating sections 171 for heating the wafer W, a hydrophobic section 172 for making the surface of the wafer W hydrophobic, a delivery section 173 including a delivery table for delivering the wafer W between the delivery arm 23 of the cassette station S1 and the substrate transfer device MA in the shelf unit R1 and for delivering the wafer W between a later-described delivery arm 109 of the interface station S3 and the substrate transfer device MA in the shelf unit R2, and an alignment section 174 for performing alignment of the wafer W in the shelf unit R1 are vertically arranged in the aforesaid shelf units R (R1, R2, R3).

The aforesaid substrate transfer device MA is the same, for example, with the one shown in FIG. 6.

Thus, in the process station S2, the substrate transfer device MA delivers the wafer W to the respective coating units C, the respective developing units D, the respective cooling sections 103, and the respective shelf units R, and the transfer arm A1 delivers the wafer W to the coating unit C1, the developing unit D1, the cooling sections 3A, 3B, 3C via the exclusive transfer area E1, and the transfer arm A2 delivers the wafer W to the coating unit C2, the developing unit D2, the cooling sections 3D, 3E, 3F via the exclusive transfer area E2.

The interface station S3 is connected next to the process station S2, and the exposure unit S4 for exposing the wafer W formed with a resist film is connected to the back side of the interface station S3. The interface section S3 includes the delivery arm 109 for delivering the wafer W between the process station S2 and the exposure unit S4.

Next, an operative sequence of the above-described embodiment will be explained. First, an automatic transfer robot (or an operator) carries the cassette 22 housing, for example, the 25 wafers W onto the cassette stage 21 and the wafer W is removed from the cassette 22 by the delivery arm 23 to be placed in the delivery section 173 in the shelf unit R1 of the process station S2.

The wafer W is transferred to the hydrophobic section 172 in the shelf unit R by the substrate transfer device MA to make the surface of the wafer W hydrophobic and then transferred to the cooling section 103 in the process unit U by the substrate transfer device MA to be cooled to a predetermined temperature, for example, to 23° C. Subsequently, the wafer W is coated with the resist solution as the processing solution in the coating unit C, and these process will be explained with the examples as shown with the coating unit C1 of the process unit U1 and the cooling section 3A in FIG. 20 and FIG. 21.

Figure 20A:
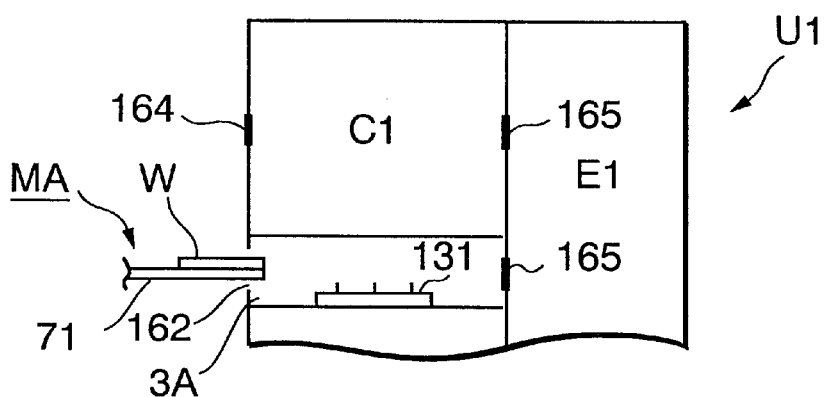
FIG. 20A to FIG. 20D are process views explaining operational sequences of the coating and processing apparatus.
Figure 20B:
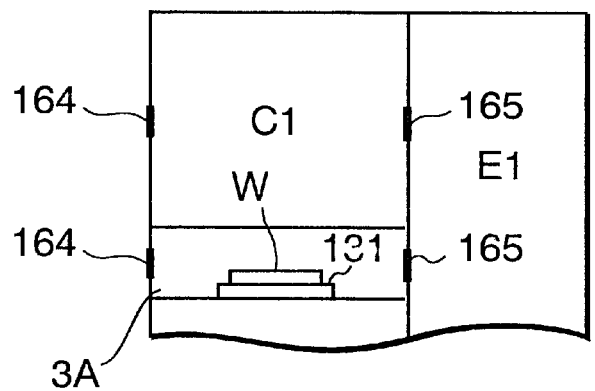
Figure 20C:
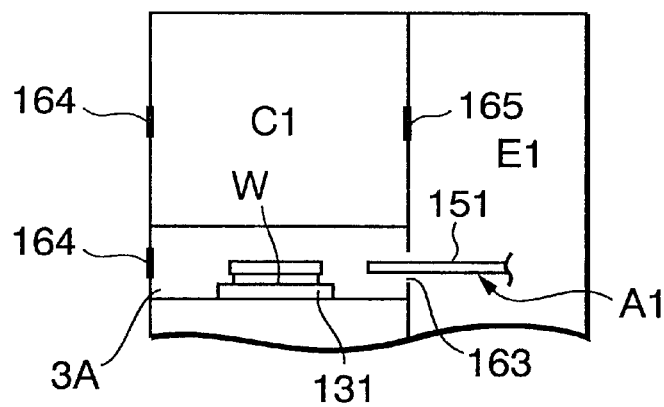
Figure 20D:
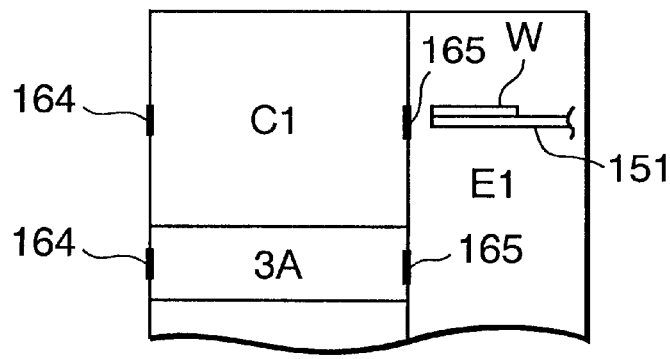

First, as shown in FIG. 20A, the lid portion 164 of the first delivery port 162 of the cooling section 3A is opened, the wafer W in the hydrophobic section is delivered onto the cooling plate 131 by the substrate transfer device MA, then, as shown in FIG. 20B, the lid portion 164 of the first delivery port 162 is closed to make the cooling section 3A close spatially, and the wafer W is subjected to the temperature adjustment by being cooled to a predetermined temperature, for example, to 23° C. Then, as shown in FIG. 20C, the lid portion 165 of the second delivery port 163 is opened, the wafer W is delivered to the transfer arm A1, then the lid portion 165 of the second delivery port 163 is closed, and, as shown in FIG. 20D, the wafer W is transferred to a position corresponding to the second delivery port 163 of the coating unit C1 via the exclusive transfer area E1.

Figure 21A:
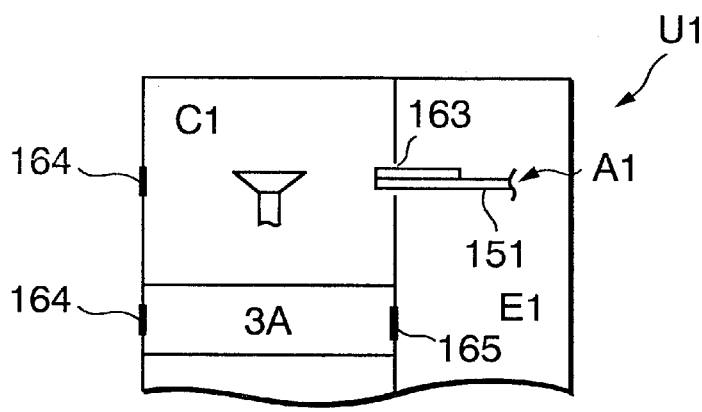
FIG. 21A to FIG. 21C are process views explaining operational sequences of the coating and processing apparatus.
Figure 21B:
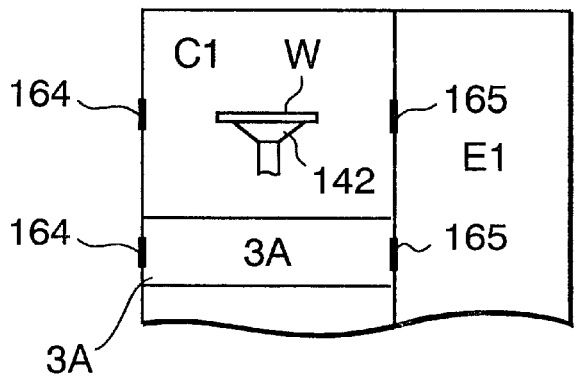
Figure 21C:
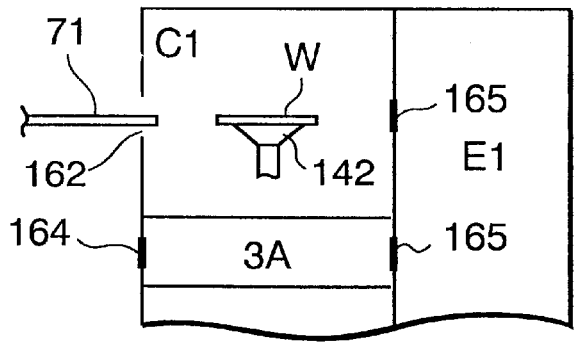

Next, as shown in FIG. 21A, the lid portion 165 of the second delivery port 163 of the coating unit C is opened, the wafer W is delivered onto the spin chuck 142 by the transfer arm A1, then, as shown in FIG. 21B, the lid portion 165 of the second delivery port 163 is closed to make the coating unit C1 close spatially, and the resist solution is coated on the wafer surface. Then, as shown in FIG. 21C, the lid portion 164 of the first delivery port 162 of the coating unit C1 is opened, the wafer W is delivered to the substrate transfer device MA, which is transferred to the heating section 171 in the shelf unit R by the substrate transfer device MA.

The wafer W which is heated to a predetermined temperature in the heating section 171 is transferred to the cooling section 103 in the process unit U by the substrate transfer device MA, in which it is subjected to the temperature adjustment by being cooled to a predetermined temperature, and subsequently, transferred by the route of the delivery arm 109 of the interface section S3→the exposure unit S4 to be exposed.

The exposed wafer W is transferred by the reverse route, that is the exposure unit S4→the delivery arm 109→the heating section 171 in the shelf unit R→the substrate transfer device MA→the cooling section 103 in the process unit R→the transfer arm A→the developing unit D. Thus, the wafer W is heated to a predetermined temperature, cooled to a predetermined temperature, for example, to 23° C., to be subjected to the temperature adjustment in the heating section→the cooling section 103, and then the wafer W undergoes the developing processing in the developing unit D. The process of the cooling section 103→the developing unit D is performed similarly to the process of the cooling section 3→the coating unit C in the respective sections spatially closed.

Subsequently, the wafer W is transferred by the route of the substrate transfer device MA→the heating section 171 in the shelf unit R→the substrate transfer device MA→the cooling section 3 in the process unit U→the substrate transfer device MA→the delivery section 173 in the shelf unit R→the delivery arm 23, in which the wafer W, which is heated to a predetermined temperature and then cooled to a predetermined temperature is returned back, for example, to the original cassette 22 through the delivery section 173.

In the process station S2, the wafer W is successively sent to the delivery section 173 in the shelf unit R, and then transferred by the route of the vacant hydrophobic section 172→the vacant cooling section 103 in the process unit U→the vacant coating unit C→the vacant heating section 171 in the shelf unit R→the vacant cooling section 103 in the process unit U→the interface station S3, and the exposed wafer W should be transferred by the route of the delivery arm 109 of the interface station S3→the vacant heating section 171 in the shelf unit R→the vacant cooling section 103 in the process unit U→the vacant developing unit D→the vacant heating section 171 in the shelf unit R→the vacant cooling section 103 in the process unit U→the delivery section 173.

In the above embodiment, since the process sections such as the coating unit C and the cooling sections 3 are multi-layered and provided adjacent to each other, the exclusive transfer arm A which transfers the wafer W therebetween can be provided and the exclusive transfer area E which is adjacent thereto can be formed.

Thus, when the transfer of the wafer W between the process section and the cooling section 103 is performed by the exclusive transfer arm A, a burden imposed on the substrate transfer device MA is lightened compared with the conventional case where the transfer of the wafer W in the process station S2 is all performed by the substrate transfer device MA. Therefore, it is possible to access to each section without making the waiting time of the wafer W, which results in the improvement of throughput.

Further, the exclusive transfer area E is provided so that the transfer area E can be partitioned off, whereby the area E is less influenced by heat sources, for example, the heating section 171 in the shelf unit R or the like. Therefore, in the transfer of the wafer W from the cooling section 103→the coating unit C and from the cooling section 103→the developing unit D, the wafer W the temperature of which is controlled in the cooling section 103 can be transferred to the coating unit C and the developing unit D while maintaining a high temperature accuracy. Thereby, the resist coating and the developing can be performed at a predetermined temperature so that a change of a film thickness and a developing line width due to the temperature change can be prevented, and a uniform processing can be performed without the formation of an uneven processing.

Moreover, since the transfer area E of the transfer arm A is partitioned off, the temperature and the humidity in this area E can be adjusted with high accuracy. Thereby, when the temperature of the transfer area E is set to be 23° C. as in the above example, the wafer W which is subjected to the temperature adjustment to 23° C. in the cooling section 103 is transferred to the coating unit C via the transfer area of 23° C., and hence the temperature of the wafer W does not change by being influenced by the atmosphere of the transfer area E during the transfer. Therefore, the wafer W can be transferred to the coating unit C and the developing unit D while maintaining a higher temperature accuracy, which makes it possible to perform the coating processing more evenly.

As in this embodiment, a plurality of the process sections and a plurality of the cooling sections 103 are multi-tiered, and the transfer of the wafer W among them is performed by one transfer arm A, which causes an advantage that the area occupied by the transfer area E becomes smaller since the wafer W is transferred via the common transfer area E.

Further in this embodiment, the coating processing section such as the coating unit C, the cooling section 103, and the transfer area E of the wafer W are partitioned off and each of which has the spatially closed space, which makes it possible to adjust the temperature and the humidity in each area separately with high accuracy. Therefore, the temperature of the cooling section 103 and the process section less influence each other, the temperature adjustment in each section becomes easier, and a time required for the atmosphere adjustment can be shortened, which results in the improvement of throughput.

Moreover, in the present invention, since each of the coating processing section such as the coating unit C, the cooling section 103 and the transfer area of the wafer W is spatially closed as described above, it is possible to adjust the atmosphere in each area separately. Namely, the setting of the temperature and the humidity, the setting of a particle amount, the setting of the pressure and so on can be changed by each section, and hence it can be applied to the processing in which the atmosphere in each section is different.

Figure 22:
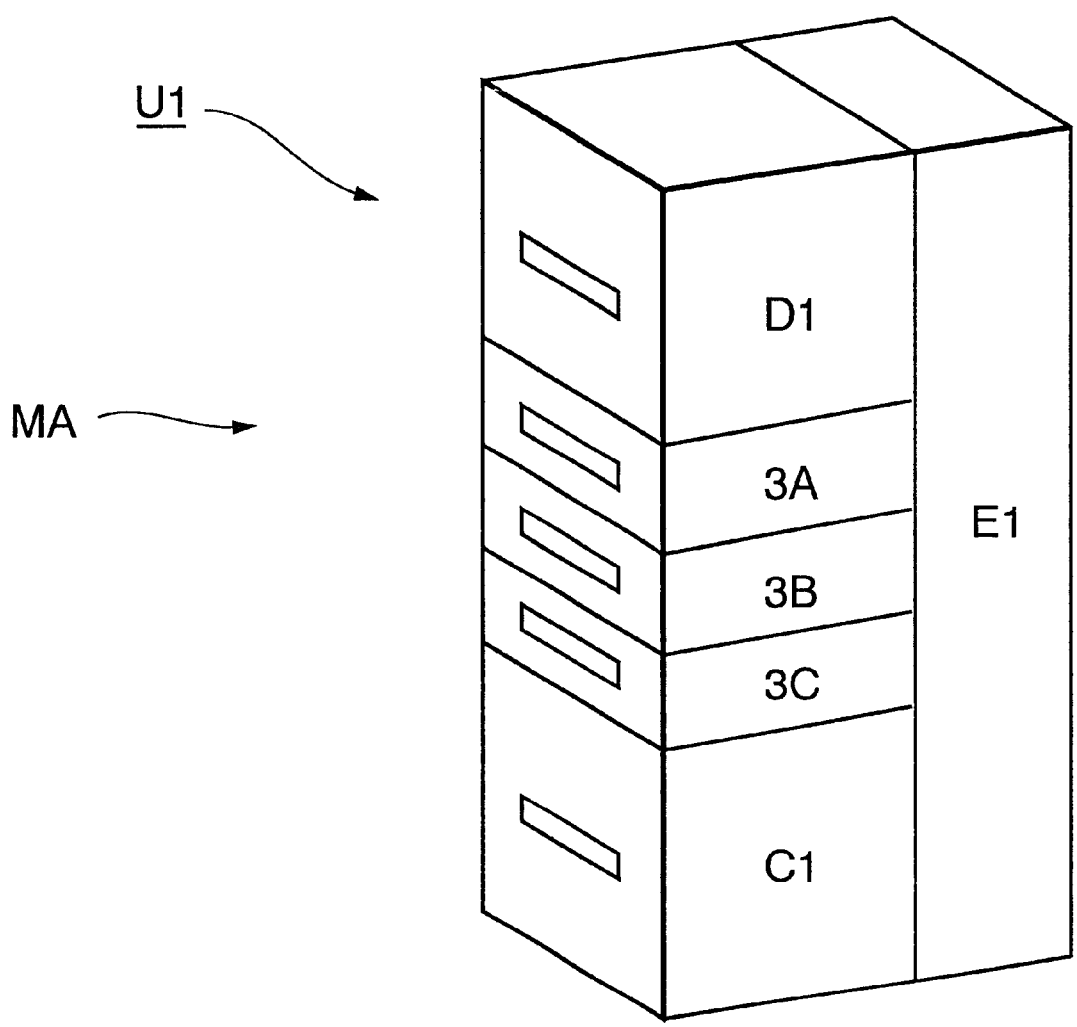
FIG. 22 is a schematic plane view of another example of the process unit.

In the above example as described above, the exclusive transfer arms A1, A2 are prepared by each process unit U1, U2, whereas all the transfer among the coating processing units and the cooling sections 103 may be performed by one transfer arm A. Further, the layout and the number of the coating processing sections and the cooling sections 103 are not limited to the above example, and it may be so structured, for example as shown in FIG. 22, that the coating unit C and the developing unit D are arranged vertically with the cooling section 3 therebetween, and there may be only one cooling section 103. Further, these are not restrictive and the developing unit D, the coating unit C and the cooling section 3 may be multi-layered from the top, the coating unit C, the developing unit D and the cooling section 3 may be multi-layered from the top, and the heating section, coating unit C, and the developing unit D may be multi-layered from the top. The present invention can be applied to the various multi-layered patterns of the units.

Figure 23:
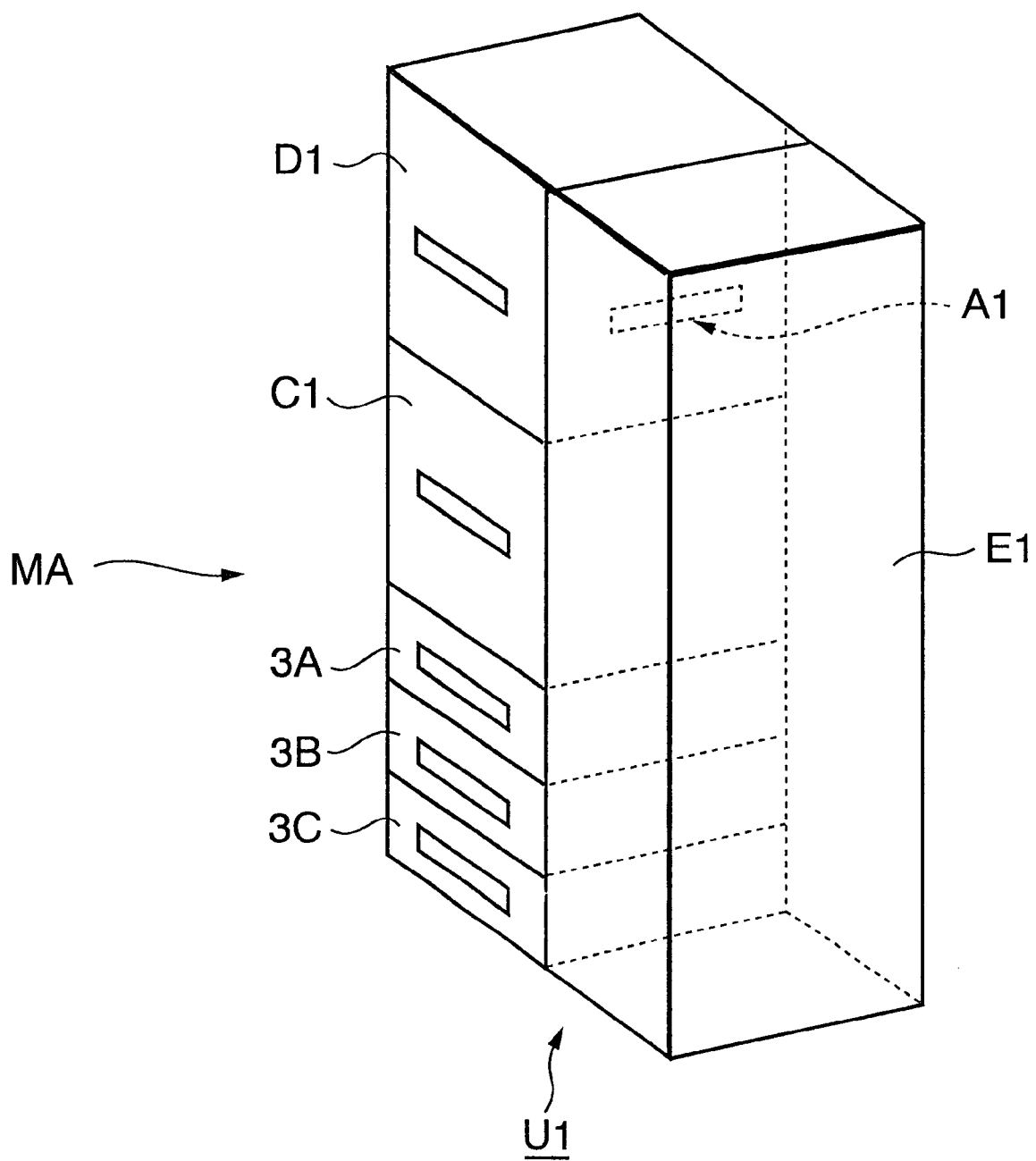
FIG. 23 is a schematic plane view of still another example of the process unit.
Figure 24:
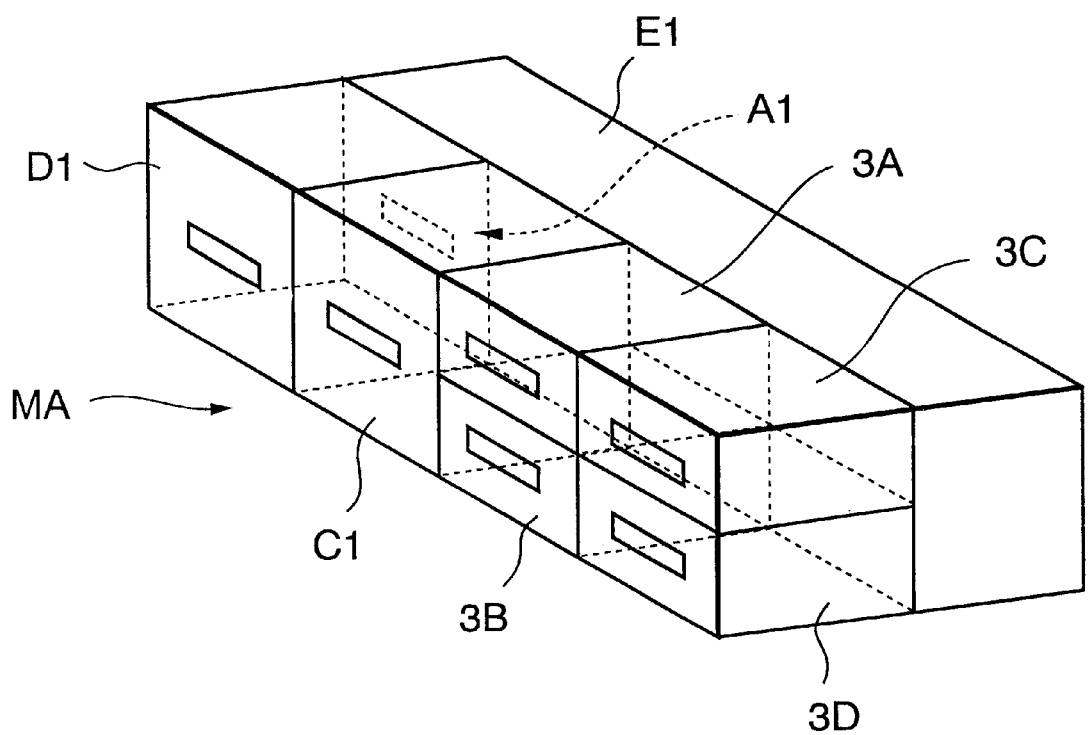
FIG. 24 is a schematic plane view of still another example of the process unit.

Further, as shown in FIG. 23, the coating processing section and the cooling section 103 may be multi-layered vertically and the transfer area E of the transfer arm A may be formed in such a manner to be adjacent thereto, in which case the transfer arm A accesses to the coating processing section and the like from the side perpendicular to the side to which the substrate transfer device MA accesses. Moreover, as shown in FIG. 24, the coating processing section and the cooling section 103 may be provided adjacent to each other and the transfer area E of the transfer arm A may be formed adjacently to the opposite side to the side to which the substrate transfer device MA accesses.

Furthermore, the cooling section 3 which cools the wafer W before transferred to the interface section S3 and the cooling section 3 which cools the wafer W before returned back to the cassette station S1 after the developing processing may be provided in the shelf unit R, whereas only the cooling section 3 which cools the wafer W before transferred to the coating unit C and the developing unit D may be provided to be adjacent to the coating processing section.

Further in the present invention, when the exclusive transfer area E for transferring the wafer W between the coating processing section and the cooling section 103 is spatially closed, the cooling section 103 and the coating processing section are not necessarily closed spaces since the wafer W the temperature of which is adjusted in the cooling section 3 can be transferred to the coating processing section while maintaining its temperature, but there are the advantages that the temperature adjustment of the wafer W in the cooling section 3 becomes easier when the cooling section 103 is spatially closed, and the atmosphere in the coating processing section, the cooling section 103 and the transfer area E can be adjusted separately when the coating processing section is spatially closed.

Furthermore in the present invention, an anti-reflection film may be formed on the surface of the wafer W before coating the resist, instead of the hydrophobic processing. In this case, since the wafer W is cooled to a predetermined temperature before the formation of the anti-reflection film, it is preferable, for example, that a unit for forming the anti-reflection film is added to the coating processing section, and the transfer of the wafer W between the cooling section 3 and an anti-reflection forming unit is performed by the exclusive transfer arm A. Incidentally, the anti-reflection film is formed to prevent the reflection which occurs in the lower side of the resist in the exposure when the chemically amplified resist is used. Further, in the present invention, the substrate is not limited to the wafer, and may be a glass substrate for a liquid crystal display.

According to the present invention, the coating processing can be performed while maintaining the temperature and the humidity of the substrate with high accuracy, which makes it possible to improve the uniformity of the processing. Further, according to the present invention, the transfer of the substrate between the coating processing section and the cooling section is performed by the transfer means, which lighten the burden imposed on the substrate transfer device.

The disclosure of Japanese Patent Applications No. 11-363085 filed Dec. 21, 1999 and No. 11-361512 filed Dec. 20, 1999, including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing method for transferring a substrate cooled by a cooling plate to a coating processing section and for coating a processing solution onto the substrate in the coating processing section, comprising the steps of:

detecting the temperature of an area to where the substrate is transferred; and adjusting the temperature of the substrate cooled by the cooling plate based on the detected temperature so that the temperature of the substrate transferred to the coating processing section is made to be the same with a supplying temperature of the processing solution.

2. The method as set forth in claim 1, further comprising the steps of:

detecting the humidity of the area to where the substrate is transferred; and compensating the temperature of the substrate to be adjusted based on the detected humidity.

3. The method as set forth in claim 2, further comprising the step of:

controlling the humidity of at least the area to where the substrate is transferred to become the desired humidity based on the detected humidity.

4. The method as set forth in claim 1, wherein the coating processing section is for coating a resist solution onto the substrate.

5. The method as set forth in claim 2, wherein the coating processing section is for supplying a developing solution onto the substrate.

6. A substrate processing method for transferring a substrate cooled by a cooling plate to a coating processing section and for coating a processing solution onto the substrate in the coating processing section, comprising the steps of:

supplying the gas with its temperature adjusted to the surface to be processed of the substrate; and transferring the substrate from the cooling plate to the coating processing section while supplying the gas.

7. The method as set forth in claim 6, wherein the temperature of the gas supplied to the surface to be processed of the substrate is adjusted to be the same with a coating temperature of the processing solution in the coating processing section.

8. A substrate processing apparatus having a mounting portion for mounting a substrate cassette housing a plurality of substrates, a cassette station including a delivery device for delivering the substrate to the substrate cassette mounted on the mounting portion, and a process station connected to the cassette station for processing the substrate transferred by the delivery device, wherein the process station, comprising:

a cooling plate for cooling the substrate;

a coating processing section for coating a processing solution onto the substrate;

a substrate transfer device for transferring the substrate cooled by said cooling plate to said coating processing section;

a temperature detector for detecting the temperature of an area to where the substrate is transferred by said substrate transfer device; and a control section for adjusting the temperature of said cooling plate based on a detected value by said temperature detector so that the temperature of the substrate when transferred to said coating processing section becomes the same with a coating temperature of the processing solution.

9. The apparatus as set forth in claim 8, further comprising:

a humidity detector for detecting the humidity of the area to where the substrate is transferred; and a temperature compensation section for compensating the temperature of the substrate to be adjusted based on the detected humidity.

10. The apparatus as set forth in claim 9, further comprising:

a humidity control section for controlling the humidity of at least the area to where the substrate is transferred to become the desired humidity based on the detected humidity.

11. The apparatus as set forth in claim 8, wherein said coating processing section is a resist coating unit for coating a resist solution onto the substrate.

12. The apparatus as set forth in claim 10, wherein said coating processing section is a developing solution supply unit for supplying a developing solution onto the substrate.

13. The apparatus as set forth in claim 8, wherein an exposure unit can be connected to the opposite side of the cassette station of the process station; and further comprising:

an interface station connected to the opposite side of the cassette station of the process station for delivering the substrate between the process station and the exposure unit.

14. A substrate processing apparatus having a mounting portion for mounting a substrate cassette housing a plurality of substrates, a cassette station including a delivery device for delivering the substrate to the substrate cassette mounted on the mounting portion, and a process station connected to the cassette station for processing the substrate transferred by the delivery device, wherein the process station, comprising:

a cooling plate for cooling the substrate;

a coating processing section for coating a processing solution onto the substrate;

a substrate transfer device for transferring the substrate between said cooling plate and said coating processing section; and a gas supply part for supplying the gas to the surface to be processed of the substrate with its temperature adjusted, while the substrate is transferred from said cooling plate to said coating processing section by said substrate transfer device.

15. The apparatus as set forth in claim 14, wherein the temperature of the gas supplied to the surface to be processed of the substrate is adjusted to be the same with a coating temperature of the processing solution in said coating processing section.

16. A substrate processing apparatus, comprising:

a cooling plate for cooling a substrate;

a coating processing section for coating a processing solution onto the substrate;

a substrate transfer device for transferring the substrate cooled by said cooling plate to said coating processing section;

a temperature detector for detecting the temperature of an area to where the substrate is transferred by said substrate transfer device; and a control section for adjusting the temperature of said cooling plate so that the temperature of the substrate when transferred to said coating processing section becomes the same with a coating temperature of the processing solution based on a detected value by said temperature detector.

* * * * *